(12) United States Patent
Watanabe et al.

(10) Patent No.: US 9,048,620 B2
(45) Date of Patent: Jun. 2, 2015

(54) SEMICONDUCTOR LASER DEVICE

(75) Inventors: Hideki Watanabe, Kanagawa (JP); Masaru Kuramoto, Kanagawa (JP); Tomoyuki Oki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/995,409

(22) PCT Filed: Jan. 11, 2012

(86) PCT No.: PCT/JP2012/050373
§ 371 (c)(1),
(2), (4) Date: Aug. 29, 2013

(87) PCT Pub. No.: WO2012/098965
PCT Pub. Date: Jul. 26, 2012

(65) Prior Publication Data
US 2013/0336349 A1 Dec. 19, 2013

(30) Foreign Application Priority Data
Jan. 18, 2011 (JP) .................. 2011-007648

(51) Int. Cl.
*H01S 5/00* (2006.01)
*H01S 5/065* (2006.01)
(Continued)

(52) U.S. Cl.
CPC ............. *H01S 5/0658* (2013.01); *H01S 5/1014* (2013.01); *H01S 5/141* (2013.01);
(Continued)

(58) Field of Classification Search
CPC ....... H01S 5/30; H01S 3/1115; H01S 3/1061; H01S 3/1118; H01S 5/0601; H01S 5/0609; H01S 5/2022; H01S 5/2219; G01J 1/52
USPC ........................................ 372/70, 45.013, 20
See application file for complete search history.

(56) References Cited

U.S. PATENT DOCUMENTS

2010/0020838 A1* 1/2010 Oota et al. ............... 372/45.013

FOREIGN PATENT DOCUMENTS

JP 05-304333 11/1993
JP 10-229252 * 8/1998 ............... H01S 3/18
(Continued)

OTHER PUBLICATIONS

J. M. Verdiell et al., Semiconductor MOPA with monolithically integrated 5 GHz electroabsorption modulator, Electronics Letters, vol. 31, No. 14, Jul. 6, 1995, pp. 1187-1188. (3 pages).

(Continued)

*Primary Examiner* — Xinning Niu
*Assistant Examiner* — Vu A Vu
(74) *Attorney, Agent, or Firm* — K&L Gates LLP

(57) ABSTRACT

A bi-section type GaN-based semiconductor laser device that has a configuration and a structure in which damage is less likely to be caused in a region in a saturable absorption region that faces a first light emission region is provided. The semiconductor laser device includes a first light emission region, a second light emission region, a saturable absorption region sandwiched by the foregoing light emission regions, a first electrode, and a second electrode. Laser light is emitted from an end face on a second light emission region side thereof. The second electrode is configured of a first portion, a second portion, and a third portion. $1 < W_{2\text{-}ave}/W_{1\text{-}ave}$ is satisfied where $W_{1\text{-}ave}$ is an average width of a portion having a ridge stripe structure of the first portion and $W_{2\text{-}ave}$ is an average width of a portion having a ridge stripe structure of the second portion.

11 Claims, 12 Drawing Sheets

(51) Int. Cl.
  *H01S 5/10* (2006.01)
  *H01S 5/14* (2006.01)
  *H01S 5/028* (2006.01)
  *B82Y 20/00* (2011.01)
  *H01S 5/06* (2006.01)
  *H01S 5/0625* (2006.01)
  *H01S 5/22* (2006.01)
  *H01S 5/343* (2006.01)

(52) U.S. Cl.
  CPC ............ *H01S 5/0287* (2013.01); *H01S 5/0657* (2013.01); *B82Y 20/00* (2013.01); *H01S 5/0602* (2013.01); *H01S 5/0625* (2013.01); *H01S 5/22* (2013.01); *H01S 5/34333* (2013.01); *H01S 5/222* (2013.01); *H01S 2301/176* (2013.01)

(56) References Cited

FOREIGN PATENT DOCUMENTS

| | | |
|---|---|---|
| JP | 2004-007002 | 1/2004 |
| JP | 2004-188678 | 7/2004 |
| JP | 2007-234868 | 9/2007 |
| JP | 2008-047692 | 2/2008 |
| JP | 2010-027935 | 2/2010 |
| JP | 2010-251712 | 11/2010 |
| WO | 2008/010374 | 1/2008 |

OTHER PUBLICATIONS

Stephen O'Brein et al., Operating Characteristics of a High-Power Monolithically Integrated Flared Amplifier Master Oscillator Power Amplifier, IEEE Journal of Quantum Electronics, Jun. 1993, vol. 29, No. 6, pp. 2052-2057. (6 pages).

P. M. W. Skovgaard et al., Enhanced Stability of MFA-MOPA Semiconductor Lasers Using a Nonlinear, Trumpet-Shaped Flare, IEEE Photonics Technology Letters, Sep. 1997, vol. 9, No. 9, pp. 1220-1222. (3 pages).

D. F. Welch et al., 1.1W CW, Diffraction-limited Operation of a Monolithically Integrated Flared-amplifier Master Oscillator Power Amplifier, Electronics Letters, Oct. 8, 1992, vol. 28, No. 21, pp. 2011-2013. (3 pages).

Chinese Office Action issued Oct. 24, 2014 in corresponding Chinese Application No. 201280005166.1.

Japanese Office Action issued Dec. 24, 2014 in corresponding Japanese Application No. 2011-007648.

* cited by examiner

SEMICONDUCTOR LASER DEVICE

CROSS REFERENCES TO RELATED APPLICATIONS

The present application is a national stage of International Application No. PCT/JP2012/050373 filed on Jan. 11, 2012 and claims priority to Japanese Patent Application No. 2011-007648 filed on Jan. 18, 2011, the disclosure of which is incorporated herein by reference.

BACKGROUND

The present invention relates to a semiconductor laser device.

A high-output ultrashort-pulse semiconductor laser device that is formed of a GaN-based compound semiconductor and has a light emission wavelength in a 405 nm band is expected, as a light source of a volume-type optical disk system that is expected as a next-generation optical disk system following a Blu-ray optical disk system, a light source necessary in fields such as a medical field and a bioimaging field, etc. As a method to generate short-pulse light in the semiconductor laser device, mainly, three types of methods, that is, gain switching, self-pulsation, and mode locking are known. The mode locking is further classified into active mode locking and passive mode locking. In order to generate a light pulse based on the active mode locking, it is necessary to configure an external resonator with the use of a mirror, a lens, etc. and to further perform radio-frequency (RF) modulation on the semiconductor laser device. On the other hand, in the passive mode locking, a light pulse is generated by a simple direct-current drive by utilizing self-pulsation operation of the semiconductor laser device.

In order to cause the semiconductor laser device to perform the self-pulsation operation, it is necessary to provide a light emission region and a saturable absorption region in the semiconductor laser device. Here, the semiconductor laser devices are classified, based on an arrangement state of the light emission region and the saturable absorption region, into a SAL (Saturable Absorber Layer) type, a WI (Weakly Index guide) type, etc. in which the light emission region and the saturable absorption region are arranged in a vertical direction and a multi-electrode type in which the light emission region and the saturable absorption region are arranged side by side in a resonator direction. The multi-electrode-type semiconductor laser device is known, for example, from Japanese Unexamined Patent Application Publication Nos. 2004-007002, 2004-188678, and 2008-047692. It is considered that a GaN-based semiconductor laser device of the multi-electrode type has a larger saturable absorption effect, and generates a light pulse with a narrow width, compared to a SAL-type semiconductor laser device.

As an embodiment of the GaN-based semiconductor laser device of the multi-electrode type, a semiconductor laser device including:

(a) a laminate structure in which a first compound semiconductor layer having a first conductivity type and being formed of a GaN-based compound semiconductor, a third compound semiconductor layer formed of a GaN-based compound semiconductor, the third compound semiconductor layer configuring a first light emission region, a second light emission region, and a saturable absorption region that is sandwiched by the first light emission region and the second light emission region, and a second compound semiconductor layer having a second conductivity type that is different from the first conductivity type and being formed of a GaN-based compound semiconductor are laminated in order;

(b) a strip-like second electrode formed on the second compound semiconductor layer; and (c) a first electrode electrically connected to the first compound semiconductor layer, wherein the laminate structure has a ridge stripe structure, the second electrode is configured of a first portion, a second portion, and a third portion, the first portion causing a forward bias state by applying a direct current to the first electrode via the first light emission region, the second portion causing the forward bias state by applying a direct current to the first electrode via the second light emission region, and the third portion applying an electric field to the saturable absorption region, the first portion of the second electrode is separated from the third portion of the second electrode by a first separation groove, the second portion of the second electrode is separated from the third portion of the second electrode by a second separation groove, and laser light is emitted from an end face on a second light emission region side of the semiconductor laser device is known.

CITATION LIST

Patent Literature

[Patent Literature 1]: Japanese Unexamined Patent Application Publication No. 2004-007002
[Patent Literature 2]: Japanese Unexamined Patent Application Publication No. 2004-188678
[Patent Literature 3]: Japanese Unexamined Patent Application Publication No. 2008-047692

SUMMARY

In order to cause a GaN-based semiconductor laser device of a multi-electrode type to perform pulse operation, a carrier is injected into a first light emission region and a second light emission region while applying a reverse bias to a saturable absorption region. Here, in the above-described semiconductor laser device, a value of light reflectance $r_1$ of an end face on a first light emission region side is higher than that of light reflectance $r_2$ of the end face on the second light emission region side. Accordingly, the first light emission region has higher light intensity compared to the second light emission region. Therefore, it was found as a result of a study by the present inventors that, in a linear stripe structure, in a case in which a region of a third portion is arranged at a center of the laser device, damage is caused in the region of the third portion that faces the first portion of the second electrode or in a region of the saturable absorption region that faces the first light emission region and an issue is easily caused in long-term reliability. The foregoing Unexamined Patent Application Publications do not refer to such a fact that damage is caused in a reverse-bias application portion of the second electrode or in the saturable absorption region.

Accordingly, an objective of the present invention is to provide a GaN-based semiconductor laser device of a multi-electrode type that has a configuration and a structure in which damage is less likely to be caused in the region of the third portion of the second electrode that faces a second portion of the second electrode or in the saturable absorption region that faces the first light emission region.

A semiconductor laser device according to each of a first embodiment and a second embodiment of the present invention for achieving the above-described objective is a semiconductor laser diode including:

(a) a laminate structure in which a first compound semiconductor layer having a first conductivity type and being formed of a GaN-based compound semiconductor, a third compound semiconductor layer formed of a GaN-based compound semiconductor, the third compound semiconductor layer configuring a first light emission region, a second light emission region, and a saturable absorption region that is sandwiched by the first light emission region and the second light emission region, and a second compound semiconductor layer having a second conductivity type that is different from the first conductivity type and being formed of a GaN-based compound semiconductor are laminated in order;

(b) a second electrode formed on the second compound semiconductor layer; and (c) a first electrode electrically connected to the first compound semiconductor layer, wherein the laminate structure has a ridge stripe structure, the second electrode is configured of a first portion, a second portion, and a third portion, the first portion causing a forward bias state by applying a direct current to the first electrode via the first light emission region, the second portion causing the forward bias state by applying a direct current to the first electrode via the second light emission region, and the third portion applying an electric field to the saturable absorption region, the first portion of the second electrode is separated from the third portion of the second electrode by a first separation groove, the second portion of the second electrode is separated from the third portion of the second electrode by a second separation groove, laser light is emitted from an end face on a second light emission region side of the semiconductor laser device.

It is to be noted that such a configuration and such a structure of the semiconductor laser device may be referred to as "laser structure of the semiconductor laser device of the present invention" in some cases.

Further, in the semiconductor laser device according to the first embodiment of the present invention, $$1 < W_{2\text{-}ave}/W_{1\text{-}ave}$$

is satisfied, and preferably, $$1 < W_{2\text{-}ave}/W_{1\text{-}ave} \leq 4.5$$

may be satisfied, where $W_{1\text{-}ave}$ is an average width of a portion having the ridge stripe structure of the first portion of the second electrode and $W_{2\text{-}ave}$ is an average width of a portion having the ridge stripe structure of the second portion of the second electrode.

Further, in the semiconductor laser device according to the second embodiment of the present invention, $$D_{sa}/D_c < 1$$

is satisfied, and preferably, $$0.4 \leq D_{sa}/D_c < 1$$

may be satisfied, where $D_c$ is a distance, along an axial line of the semiconductor laser device, from an end face on a first light emission region side to a center of the semiconductor laser device, and $D_{sa}$ is a distance, along the axial line of the semiconductor laser device, from the end face on the first light emission region side to a center of the saturable absorption region.

As a result of the study by the present inventors, occurrence of damage was often found in the region (hereinafter, may be referred to as "first region of the third portion" in some cases) of the third portion that faces the first portion of the second electrode or in a boundary region (hereinafter, may be referred to as "first region of the saturable absorption region" in some cases) of the first light emission region and the saturable absorption region. In the semiconductor laser device according to the first embodiment of the present invention, $1 < W_{2\text{-}ave}/W_{1\text{-}ave}$ is satisfied, and in the semiconductor laser device according to the second embodiment of the present invention, $D_{sa}/D_c < 1$ is satisfied. Accordingly, occurrence of a phenomenon that light intensity of the first region of the saturable absorption region becomes excessively high is suppressed, and therefore, damage is less likely to be caused in the first region of the saturable absorption region. Also, an electric field is less likely to be concentrated on the first region of the third portion, and therefore, damage is less likely to be caused in the third portion of the second electrode.

Additional features and advantages are described herein, and will be apparent from the following Detailed Description and the figures.

BRIEF DESCRIPTION OF THE FIGURES

FIG. 3 is a schematic end-face view (a schematic end-face view taken when the semiconductor laser device is cut in an XZ plane) of the semiconductor laser device of Example 1 along a direction in which a resonator extends.

FIG. 4 is a schematic cross-sectional view (a schematic cross-sectional view taken when the semiconductor laser device is cut in a YZ plane) of the semiconductor laser device of Example 1 along a direction orthogonal to the direction in which the resonator extends.

FIG. 5 is a model diagram of the semiconductor laser device for describing light intensity of Example 1 or light intensity in a position of each portion inside the semiconductor laser device of Example 1.

FIG. 7 is a schematic end-face view (a schematic end-face view taken when the semiconductor laser device is cut in an XZ plane) of a semiconductor laser device of Example 2 along a direction in which a resonator extends.

FIG. 8 is a graph illustrating a relationship between a value of each of the light intensity ($IL_2 + IL_7$) and the light intensity ($IL_3 + IL_6$) and a value of x in the semiconductor laser device of Example 2.

FIG. 12 is a schematic partial end-face view of the substrate etc. for describing the method of manufacturing the semiconductor laser device of Example 1, following Part (B) of FIG. 11.

MODES FOR CARRYING OUT THE INVENTION DETAILED DESCRIPTION

Figure 1:
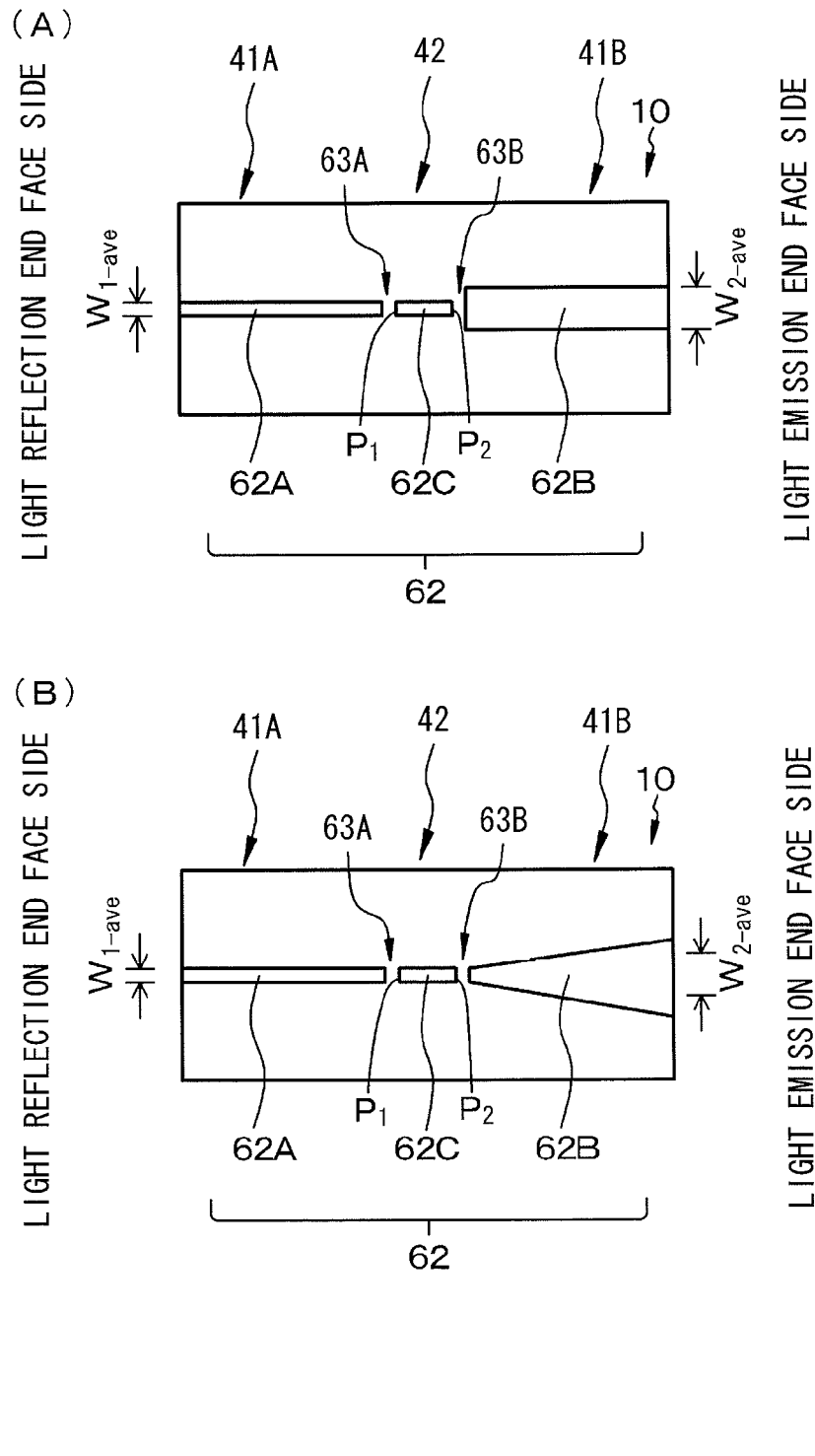
[FIG. 1] Parts (A) and (B) of FIG. 1 are each a schematic plan view of a semiconductor laser device of Example 1.

The present invention will be described below based on Examples with reference to the drawings. However, the present invention is not limited to Examples and various numerical values, materials, etc. in Examples are examples. It is to be noted that the description will be given in the following order.

1. Description related to a general semiconductor laser device according to a first embodiment and a second embodiment of the present invention
2. Example 1 (a semiconductor laser device according to the first embodiment of the present invention)
3. Example 2 (a semiconductor laser device according to the second embodiment of the present invention) and others

Description Related to a General Semiconductor Laser Device According to a First Embodiment and a Second Embodiment of Present Invention In a semiconductor laser device according to a first embodiment of the present invention including the above-described preferred form, a form may be adopted in which a value of $W_{2-ave}/W_{1-ave}$ is determined so that $$0.2 \le I_1/I_2 \le 4.5$$

is satisfied, and preferably, $$I_1/I_2=1.0$$

may be satisfied, where $I_1$ is light intensity of a portion (more specifically, the first region of the saturable absorption region that is a boundary region of the first light emission region and the saturable absorption region) of the saturable absorption region corresponding to a region (the first region of the third portion) of the third portion that faces the first portion of the second electrode, and $I_2$ is light intensity of a portion (more specifically, a boundary region of the second light emission region and the saturable absorption region, and hereinafter may be referred to as "second region of the saturable absorption region" in some cases) of the saturable absorption region corresponding to a region (hereinafter, may be referred to as "second region of the third portion") of the third portion that faces the second portion of the second electrode. It is to be noted that the range of $I_1/I_2$ was determined based on various tests. This is similarly applicable to the following description.

In the semiconductor laser device according to the first embodiment of the present invention including the above-described preferred form, a configuration may be adopted in which $$0.2 \le K_1/K_2 \le 4.5$$

is satisfied, and preferably, $$K_1/K_2=1.0$$

may be satisfied where $K_1$ and $K_2$ are set as follows.

$$K_1 \equiv \exp[g(x \cdot L_0 - L_{sa}/2)] + r_2 \cdot \exp[g(x \cdot L_0 - L_{sa}/2) - 2 \cdot \alpha \cdot L_{sa} + 2 \cdot K \cdot g\{(1-x)L_0 - L_{sa}/2\}]$$

$$K_2 \equiv \exp[g(x \cdot L_0 - L_{sa}/2) - \alpha \cdot L_{sa}] + r_2 \cdot \exp[g(x \cdot L_0 - L_{sa}/2) - \alpha \cdot L_{sa} + 2 \cdot K \cdot g\{(1-x)L_0 - L_{sa}/2\}]$$

Further, in this case, it is preferable that a value of an absorption coefficient $\alpha$ of the saturable absorption region satisfy $$0 \text{ cm}^{-1} < \alpha \le 5000 \text{ cm}^{-1},$$

and may preferably satisfy $$500 \text{ cm}^{-1} \le \alpha \le 4000 \text{ cm}^{-1}.$$

It is to be noted that the range of $K_1/K_2$ was determined based on various tests. This is similarly applicable to the following description.

It is to be noted that g and K are as follows, $$g = [2\{x + K(1-x)L_0\} - L_{sa}(1+K)]^{-1} \cdot \ln[1/\{r_1 \cdot r_2 \cdot \exp(-2 \cdot \alpha \cdot L_{sa})\}]$$

$$K \equiv W_{2-ave}/W_{1-ave}$$

where $L_0$: a distance from an end face on a first light emission region side to the end face on the second light emission region side x: a value ($L_{sa}/L_0$) obtained by normalizing a distance $L_{sa}$ from the end face on the first light emission region side to a center of the saturable absorption region by $L_0$, $0 < x < 1$ Lsa: a length of the saturable absorption region $r_1$: light reflectance of the end face on the first light emission region side $r_2$: light reflectance of the end face on the second light emission region side $\alpha$: an absorption coefficient of the saturable absorption region.

In a semiconductor laser device according to a second embodiment of the present invention including the above-described preferred form, a form may be adopted in which a value of $D_{sa}/D_c$ is determined so that $$0.2 \le I_1/I_2 \le 4.5$$

is satisfied, and preferably, $$I_1/I_2=1.0$$

may be satisfied, where $I_1$ is the light intensity of the portion (the first region of the saturable absorption region) of the saturable absorption region corresponding to the region (the first region of the third portion) of the third portion that faces the first portion of the second electrode, and $I_2$ is the light intensity of the portion (the second region of the saturable absorption region) of the saturable absorption region corresponding to the region (the second region of the third portion) of the third portion that faces the second portion of the second electrode.

In the semiconductor laser device according to the second embodiment of the present invention including the above-described preferred form, a configuration may be adopted in which $$0.2 \le K_1/K_2 \le 4.5$$

is satisfied, and preferably, $$K_1/K_2=1.0$$

may be satisfied where $K_1$ and $K_2$ are set as follows.

$$K_1 \equiv \exp[g(x \cdot L_0 - L_{sa}/2)] + r_2 \cdot \exp[g(x \cdot L_0 - L_{sa}/2) - 2 \cdot \alpha \cdot L_{sa} + 2 \cdot g\{(1-x)L_0 - L_{sa}/2\}]$$

$$K_2 \equiv \exp[g(x \cdot L_0 - L_{sa}/2) - \alpha \cdot L_{sa}] + r_2 \cdot \exp[g(x \cdot L_0 - L_{sa}/2) - \alpha \cdot L_{sa} + 2 \cdot g\{(1-x)L_0 - L_{sa}/2\}]$$

Further, in this case, it is preferable that the value of the absorption coefficient α of the saturable absorption region satisfy $$0 \text{ cm}^{-1} < \alpha \leq 5000 \text{ cm}^{-1},$$

and preferably satisfy $$500 \text{ cm}^{-1} \leq \alpha \leq 4000 \text{ cm}^{-1}.$$

It is to be noted that g is as follows, $$g = [2(L_0 - L_{sa})]^{-1} \cdot \ln[1/\{r_1 \cdot r_2 \cdot \exp(-2 \cdot \alpha \cdot L_{sa})\}]$$

where
$L_0$: the distance from the end face on the first light emission region side to the end face on the second light emission region side
x: the value ($L_{sa}/L_0$) obtained by normalizing the distance $L_{sa}$ from the end face on the first light emission region side to the center of the saturable absorption region by $L_0$, $0 < x < 1/2$
$L_{sa}$: the length of the saturable absorption region
$r_1$: the light reflectance of the end face on the first light emission region side
$r_2$: the light reflectance of the end face on the second light emission region side
α: the absorption coefficient of the saturable absorption region.

In the semiconductor laser devices according to the first embodiment and the second embodiment of the present invention including the above-described preferred forms and configurations, a form may be preferably adopted in which a value of a voltage (reverse bias voltage) $V_{sa}$ that is applied to the third portion of the second electrode is equal to or smaller than −2 volts (in other words, $V_{sa}$ has a negative value and satisfies $|V_{sa}| \geq 2$ volts).

In the semiconductor laser devices (hereinafter, may be collectively and simply referred to as "semiconductor laser device of the present invention") according to the first embodiment and the second embodiment of the present invention including the above-described preferred forms and configurations, it is desirable that an electrical resistance value between the first portion and the third portion of the second electrode and an electrical resistance value between the second portion and the third portion of the second electrode may be 1×10 times or more of an electrical resistance value between the second electrode and the first electrode, preferably, 1×10² times or more thereof, and more preferably, 1×10³ times or more thereof. Alternatively, it is desirable that the electrical resistance value between the first portion and the third portion of the second electrode and the electrical resistance value between the second portion and the third portion of the second electrode may be 1×10²Ω or larger, preferably, 1×10³Ω or larger, and more preferably, 1×10⁴Ω or larger.

In such a semiconductor laser device, the electrical resistance value between the first portion and the third portion of the second electrode and the electrical resistance value between the second portion and the third portion of the second electrode may be 1×10 times or more of the electrical resistance value between the second electrode and the first electrode, or may be 1×10²Ω or larger. Accordingly, flow of a leakage current from the first portion to the third portion of the second electrode, and from the second portion to the third portion of the second electrode is surely suppressed. In other words, the reverse bias voltage $V_{sa}$ that is applied to the saturable absorption region (carrier non-injection region) is increased, and therefore, mode-locking operation of a single mode that has a light pulse having a short time width is achieved. Such a high electrical resistance value between the first portion and the third portion of the second electrode and between the second portion and the third portion of the second electrode is achieved only by separating the second electrode into the first portion and the third portion and into the second portion and the third portion of the second electrode by a first separation groove and a second separation groove.

Moreover, although this is not limitative, in the semiconductor laser device of the present invention, a form may be adopted in which
the third compound semiconductor layer has a quantum-well structure including a well layer and a barrier layer,
a thickness of the well layer is 1 nm or larger and 10 nm or smaller, and may preferably be 1 nm or larger and 8 nm or smaller, and
an impurity doping concentration of the barrier layer is $2 \times 10^{18}$ cm$^{-3}$ or higher and $1 \times 10^{20}$ cm$^{-3}$ or lower, and may preferably be $1 \times 10^{19}$ cm$^{-3}$ or higher and $1 \times 10^{20}$ cm$^{-3}$ or lower.

By determining the thickness of the well layer configuring the third compound semiconductor layer to be 1 nm or larger and 10 nm or smaller, and further determining the impurity doping concentration of the barrier layer configuring the third compound semiconductor layer to be $2 \times 10^{18}$ cm$^{-3}$ or higher and $1 \times 10^{20}$ cm$^{-3}$ or lower, in other words, by reducing the thickness of the well layer, and further, increasing the carrier in the third compound semiconductor layer, in such a manner, an influence of piezo polarization is allowed to be reduced. Accordingly, a laser light source having a short time width that is capable of generating a single-peak light pulse having less sub-pulse component is obtainable. Moreover, mode-locking drive is allowed to be achieved by the reverse bias voltage as low as possible, and a light pulse train that is synchronized with an external signal (an electric signal and an optical signal) is allowed to be generated. A configuration in which the impurity with which the barrier layer is doped is silicon (Si) may be adopted but this is not limitative, and the impurity may be oxygen (O) other than this.

Alternatively, in the semiconductor laser device of the present invention, a width of the first separation groove and the second separation groove that separate the second electrode into the first portion and the third portion and into the second portion and the third portion of the second electrode may desirably be 2 μm or larger and 40% or less of a resonator length of the semiconductor laser device (hereinafter, simply referred to as "resonator length"), and may preferably be 10 μm or larger and 20% or less of the resonator length. The resonator length may be, for example, 0.6 mm, which is not limitative.

In the semiconductor laser device of the present invention, laser light is emitted from the end face (for the sake of convenience, referred to as "light emission end face") on the second light emission region side.

The semiconductor laser device of the present invention may have a form of a semiconductor laser device that has a separate confinement heterostructure (SCH structure) of a ridge stripe type. Alternatively, the semiconductor laser device of the present invention may have a form of a semiconductor laser device that has a SCH structure of an oblique ridge stripe type. Further, the semiconductor laser device of the present invention is caused to perform the self-pulsation operation and the mode-locking operation by applying a direct current from the first portion and the second portion of the second electrode to the first electrode via the first light emission region and the second light emission region to cause a forward bias state, and applying the voltage (reverse bias voltage) $V_{sa}$ between the first electrode and the third portion of the second electrode to apply an electric field to the saturable absorption region.

In the semiconductor laser device of the present invention, the second electrode may have a form configured of a palladium (Pd) single layer, a nickel (Ni) single layer, a platinum (Pt) single layer, a palladium-layer/platinum-layer laminate structure in which the palladium layer is in contact with the second compound semiconductor layer, or a palladium-layer/nickel-layer laminate structure in which the palladium layer is in contact with the second compound semiconductor layer. It is to be noted that, when a lower metal layer is configured of palladium and an upper metal layer is configured of nickel, a thickness of the upper metal layer may desirably be 0.1 μm or larger, and may preferably be 0.2 μm or larger. Alternatively, the second electrode may preferably have a configuration configured of the palladium (Pd) single layer. In this case, the thickness thereof may desirably be 20 nm or larger, and may preferably be 50 nm or larger. Alternatively, the second electrode may preferably have a configuration configured of a palladium (Pd) single layer, a nickel (Ni) single layer, a platinum (Pt) single layer, or a laminate structure including a lower metal layer and an upper metal layer in which the lower metal layer is in contact with the second compound semiconductor layer (it is to be noted that the lower metal layer is configured of one type of metal selected from a group consisting of palladium, nickel, and platinum, and the upper metal layer is configured of metal having an etching rate that is the same as, the same degree as, or higher than an etching rate of the lower metal layer upon forming the first separation groove and the second separation groove in the second electrode in a later-described step (D)). Moreover, an etchant used upon forming the first separation groove and the second separation groove in the second electrode in the later-described step (D) may desirably be aqua regia, nitric acid, sulfuric acid, hydrochloric acid, or mixed solution including two or more of the foregoing acids (specifically, mixed solution of the nitric acid and the sulfuric acid or mixed solution of the sulfuric acid and the hydrochloric acid).

In the semiconductor laser device of the present invention, in the second electrode, the first portion (forward bias application portion)/the third portion (reverse bias application portion)/the second portion (forward bias application portion) are arranged from the end face on the first light emission region side. However, this configuration is not limitative. A configuration in which the forward bias application portion/the reverse bias application portion/the forward bias application portion/the reverse bias application portion/the forward bias application portion are arranged, a configuration in which the forward bias application portion/the reverse bias application portion/the forward bias application portion/the reverse bias application portion/the forward bias application portion/the reverse bias application portion/the forward bias application portion are arranged, or the like may be adopted. In other words, a state may be adopted in which N-number of light emission regions (carrier injection regions, gain regions) and (N−1) number of saturable absorption regions (carrier non-injection regions) are provided and the light emission regions are arranged to sandwich the saturable absorption region. In these cases, it is enough that the reverse bias application portion which is closest to the end face on the first light emission region side satisfy $0.2 \leq I_1/I_2 \leq 4.5$.

The semiconductor laser device of the present invention may be manufactured, for example, by the following method, although the manufacturing method may differ depending on the configuration and the structure of the semiconductor laser device to be manufactured. Specifically, the semiconductor laser device of the present invention may be manufactured based on a manufacturing method including steps of:

(A) forming, on the substrate, a laminate structure in which the first compound semiconductor layer that has a first conductivity type and is formed of a GaN-based compound semiconductor, the third compound semiconductor layer that is formed of the GaN-based compound semiconductor, and configures the first light emission region, the second light emission region, and the saturable absorption region, and the second compound semiconductor layer that has a second conductivity type different from the first conductivity type and is formed of the GaN-based compound semiconductor are laminated in order; then (B) forming the second electrode on the second compound semiconductor layer; subsequently, (C) etching part or all of the second compound semiconductor layer with the use of the second electrode as an etching mask to form the ridge stripe structure; and then (D) forming a resist layer for forming the first separation groove and the second separation groove in the second electrode, and subsequently forming the first separation groove and the second separation groove in the second electrode by a wet etching method with the use of the resist layer as a wet-etching mask, thereby separating the second electrode into the first portion and the third portion and into the second portion and the third portion by the first separation groove and the second separation groove.

Such a manufacturing method is adopted, specifically, part or all of the second compound semiconductor layer is etched with the use of the second electrode as the etching mask to form the ridge stripe structure, in other words, the ridge stripe structure is formed by a self-alignment scheme with the use of the patterned second electrode as the etching mask. Therefore, misalignment between the second electrode and the ridge stripe structure is not caused. Further, the first separation groove and the second separation groove may be preferably formed in the second electrode by the wet etching method. By thus adopting the wet etching method, unlike the dry etching method, occurrence of degradation in optical and electrical characteristics in the second compound semiconductor layer is allowed to be suppressed. Therefore, occurrence of degradation in light emission characteristics is allowed to be surely prevented.

It is to be noted that, although it depends on the configuration and the structure of the semiconductor laser device to be manufactured, in the step (C), part of the second compound semiconductor layer in a thickness direction may be etched, or all of the second compound semiconductor layer in the thickness direction may be etched. Alternatively, the second compound semiconductor layer and the third compound semiconductor layer may be etched in the thickness direction, or the second compound semiconductor layer, the third compound semiconductor layer, and part of the first compound semiconductor layer in the thickness direction may be etched.

Moreover, in the step (D), $ER_0/ER_1 \geq 1 \times 10$ may desirably be satisfied, and $ER_0/ER_1 \geq 1 \times 10^2$ may preferably be satisfied where $ER_0$ and $ER_1$ are an etching rate for the second electrode and an etching rate for the laminate structure upon forming the first separation groove and the second separation groove in the second electrode, respectively. By causing $ER_0/ER_1$ to satisfy such a relationship, the second electrode is allowed to be surely etched without etching the laminate structure (or the laminate structure is etched only slightly even if the laminate structure is etched).

Moreover, in the semiconductor laser device of the present invention, the laminate structure may have, specifically, a configuration configured of an AlGaInN-based compound semiconductor. Here, more specifically, examples of the AlGaInN-based compound semiconductor may include GaN, AlGaN, GaInN, and AlGaInN. Further, the foregoing compound semiconductors may include a boron (B) atom, a thallium (Tl) atom, an arsenic (As) atom, a phosphorous (P) atom, and/or an antimony (Sb) atom as necessary. Further, the third compound semiconductor layer (active layer) that configures the light emission region (gain region) and the saturable absorption region may preferably have a quantum well structure. Specifically, the third compound semiconductor layer may have a single quantum well structure (QW structure), or may have a multiple quantum well structure (MQW structure). The third compound semiconductor layer (active layer) that has the quantum well structure has a structure in which one or more well layers and barrier layers are laminated. Examples of a combination of (a compound semiconductor configuring the well layer, a compound semiconductor configuring the barrier layer) may include $(In_yGa_{(1-y)}N, GaN)$, $(In_yGa_{(1-y)}N, In_zGa_{(1-z)}N)$ (y>z), and $(In_yGa_{(1-y)}N, AlGaN)$.

Moreover, in the semiconductor laser device of the present invention, a structure may be adopted in which the second compound semiconductor layer has a superlattice structure in which p-type GaN layers and p-type AlGaN layers are alternately laminated and a thickness of the superlattice structure is 0.7 μm or smaller. By adopting a structure such as the foregoing superlattice structure, a series resistance component of the semiconductor laser device is reduced while maintaining a high refractive index necessary as a cladding layer, which leads to low operation voltage of the semiconductor laser device. It is to be noted that a lower limit value of the thickness of the superlattice structure may be, for example, 0.3 μm, which is not limitative. A thickness of the p-type GaN layer configuring the superlattice structure may be, for example, from 1 nm to 5 nm both inclusive. A thickness of the p-type AlGaN layer configuring the superlattice structure may be, for example, from 1 nm to 5 nm both inclusive. The total number of layers of the p-type GaN layers and the p-type AlGaN layers may be, for example, from 60 to 300 both inclusive. Further, a configuration may be adopted in which a distance from the third compound semiconductor layer to the second electrode is 1 μm or smaller, and may preferably be, 0.6 μm or smaller. By thus determining the distance from the third compound semiconductor layer to the second electrode, the thickness of the p-type second compound semiconductor layer having high resistance is reduced and reduction in operation voltage of the semiconductor laser device is achieved. It is to be noted that a lower limit value of the distance from the third compound semiconductor layer to the second electrode may be, for example, 0.3 μm, which is not limitative. Further, a configuration may be adopted in which the second compound semiconductor layer is doped with Mg of $1 \times 10^{19}$ $cm^{-3}$ or more and an absorption coefficient of the second compound semiconductor layer with respect to light having a wavelength of 405 nm from the third compound semiconductor layer is 50 $cm^{-1}$ or larger. This atomic concentration of Mg derives from a material physical property that exhibits maximum hole concentration at a value of $2 \times 10^{19}$ $cm^{-3}$ and is a result of a design that causes the maximum hole concentration, that is, the minimum specific resistance of the second compound semiconductor layer. The absorption coefficient of the second compound semiconductor layer is determined in terms of lowering the resistance of the semiconductor laser device as much as possible. As a result, an absorption coefficient of light of the third compound semiconductor layer is generally 50 $cm^{-1}$. However, in order to increase this absorption coefficient, the doping amount of Mg may be intentionally set to concentration of $2 \times 10^{19}$ $cm^{-3}$ or higher. In this case, an upper limit of the Mg doping amount by which practical hole concentration is obtained may be, for example, $8 \times 10^{19}$ $cm^{-3}$. Further, the second compound semiconductor layer may have a configuration in which the second compound semiconductor layer includes a non-doped compound semiconductor layer and a p-type compound semiconductor layer from the third compound semiconductor layer side, and a distance from the third compound semiconductor layer to the p-type compound semiconductor layer is $1.2 \times 10^{-7}$ m or smaller. By determining the distance from the third compound semiconductor layer to the p-type compound semiconductor layer, internal loss is suppressed in a range in which internal quantum efficiency is not lowered, and thereby, a threshold current density at which laser oscillation is started is reduced. It is to be noted that a lower limit value of the distance from the third compound semiconductor layer to the p-type compound semiconductor layer may be, for example, $5 \times 10^{-8}$ m, which is not limitative. Further, a configuration may be adopted in which a laminate insulating film configured of the $SiO_2/Si$ laminate structure may be formed on both side faces of the ridge stripe structure, and a difference between an effective refractive index of the ridge stripe structure and an effective refractive index of the laminate insulating film is from $5 \times 10^{-3}$ to $1 \times 10^{-2}$ both inclusive. By using such a laminate insulating film, single fundamental transverse mode is maintained even upon performing high-output operation over 100 milliwatts. Further, the second compound semiconductor layer may have, for example, a structure in which a non-doped GaInN layer (p-side light guide layer), a non-doped AlGaN layer (p-side cladding layer), a Mg-doped AlGaN layer (electron barrier layer), a superlattice structure (superlattice cladding layer) of GaN layer (Mg-doped)/AlGaN layer, and a Mg-doped GaN layer (p-side contact layer) are laminated from the third compound semiconductor layer side. A band gap of a compound semiconductor that configures the well layer in the third compound semiconductor layer may desirably be 2.4 eV or larger. Further, a wavelength of laser light emitted from the third compound semiconductor layer (active layer) may desirably be from 360 nm to 500 nm both inclusive, and may preferably be from 400 nm to 410 nm both inclusive. Here, it goes without saying that the various configurations described above may be appropriately used in combination.

In the semiconductor laser device of the present invention, various GaN-based compound semiconductor layers configuring the semiconductor laser device are sequentially formed on a substrate. Here, other than a sapphire substrate, examples of the substrate may include, a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and the foregoing substrates each provided with an underlayer, a buffer layer, etc. formed on a surface (main surface) thereof. Mainly, when the GaN-based compound semiconductor layer is formed on the substrate, the GaN substrate may be preferred due to its small defect density. However, it is known that a property of the GaN substrate is varied as polar/non-polar/semi-polar depending on a growth face. Further, examples of a method of forming various GaN-based compound semiconductor layers configuring the semiconductor laser device may include an organic metal chemical vapor deposition method (a MOCVD method, a MOVPE method), a molecular beam epitaxy method (MBE method), a hydride vapor deposition method in which a halogen contributes to transport or reaction, and the like.

Here, examples of an organic gallium source gas in the MOCVD method may include trimethylgallium (TMG) gas and triethylgallium (TEG) gas, and examples of a nitride source gas may include ammonium gas and hydrazine gas. Further, upon forming the GaN-based compound semiconductor layer having an n-type conductivity type, for example, silicon (Si) may be added as an n-type impurity (n-type dopant). Upon forming the GaN-based compound semiconductor layer having a p-type conductivity type, for example, magnesium (Mg) may be added as a p-type impurity (p-type dopant). Further, when aluminum (Al) or indium (In) is included as a constituent atom of the GaN-based compound semiconductor layer, trimethylaluminum (TMA) gas may be used as an Al source and trimethylindium (TMI) gas may be used as an In source. Further, monosilane gas ($SiH_4$ gas) may be used as a Si source, and cyclopentadienyl magnesium gas, methylcyclopentadienyl magnesium, or bis cyclopentadienyl magnesium ($Cp_2Mg$) may be used as a Mg source. Incidentally, examples of the n-type impurity (n-type dopant) other than Si may include Ge, Se, Sn, C, Te, S, O, Pd, and Po and examples of the p-type impurity (p-type dopant) other than Mg may include Zn, Cd, Be, Ca, Ba, C, Hg, and Sr.

When the first conductivity type is the n type, the first electrode that is electrically connected to the first compound semiconductor layer having the n-type conductivity type may desirably have a single-layer configuration or a multi-layer configuration that includes one or more types of metal selected from a group consisting of gold (Au), silver (Ag), palladium (Pd), Al (aluminum), Ti (titanium), tungsten (W), copper (Cu), zinc (Zn), tin (Sn), and indium (In). Examples thereof may include Ti/Au, Ti/Al, and Ti/Pt/Au. The first electrode is electrically connected to the first compound semiconductor layer. However, this encompasses a form in which the first electrode is formed on the first compound semiconductor layer and a form in which the first electrode is connected to the first compound semiconductor layer through an electrically-conductive material layer, an electrically-conductive substrate, or the like. The first electrode and the second electrode may be formed, for example, by a PVD method such as a vacuum deposition method and a sputtering method.

A pad electrode may be provided on the first electrode, the second electrode, and/or the like to establish an electric connection with an external electrode or an external circuit. The pad electrode may desirably include a single-layer configuration or a multi-layer configuration that includes one or more types of metal selected from a group consisting of Ti (titanium), aluminum (Al), Pt (platinum), Au (gold), and Ni (nickel). Alternatively, the pad electrode may have a multi-layer configuration such as a multi-layer configuration of Ti/Pt/Au and a multi-layer configuration of Ti/Au.

In the semiconductor laser device of the present invention, as described above, the reverse bias voltage $V_{sa}$ is applied between the first electrode and the third portion of the second electrode. However, to the third portion of the second electrode, a pulse current or a pulse voltage that is synchronized with a pulse current or a pulse voltage applied to the first portion and the second portion of the second electrode may be applied, or a direct current bias may be applied. Further, a form may be adopted in which a current is applied from the second electrode to the first electrode via the first light emission region and the second light emission region and an external electric signal is superimposed from the second electrode on the first electrode via the first light emission region and the second light emission region. Thus, the laser light is allowed to be synchronized with the external electric signal. Alternatively, a form may be adopted in which an optical signal enters from an end face of the laminate structure. Also in such a manner, the laser light is allowed to be synchronized with the optical signal. Further, in the second compound semiconductor layer, a non-doped compound semiconductor layer (for example, a non-doped GaInN layer or a non-doped AlGaN layer) may be formed between the third compound semiconductor layer and the electron barrier layer. Further, a non-doped GaInN layer as a light guide layer may be formed between the third compound semiconductor layer and the non-doped compound semiconductor layer. A structure may be adopted in which a Mg-doped GaN layer (p-side contact layer) occupies an uppermost layer of the second compound semiconductor layer.

The semiconductor laser device of the present invention may be applied, for example to a field such as an optical disk system, a communication field, an optical information field, a photoelectron integrated circuit, a field to which non-linear optical phenomenon is applied, an optical switch, various analysis fields such as a laser measurement field, an ultra-high-speed spectroscopy field, a multiphoton excitation spectroscopy field, a mass analysis field, a microspectroscopy field utilizing multiphoton absorption, quantum control in chemical reaction, a three-dimensional nano-processing field, various processing fields to which multiphoton absorption is applied, a medical field, and a bioimaging field.

EXAMPLE 1

Figure 2:
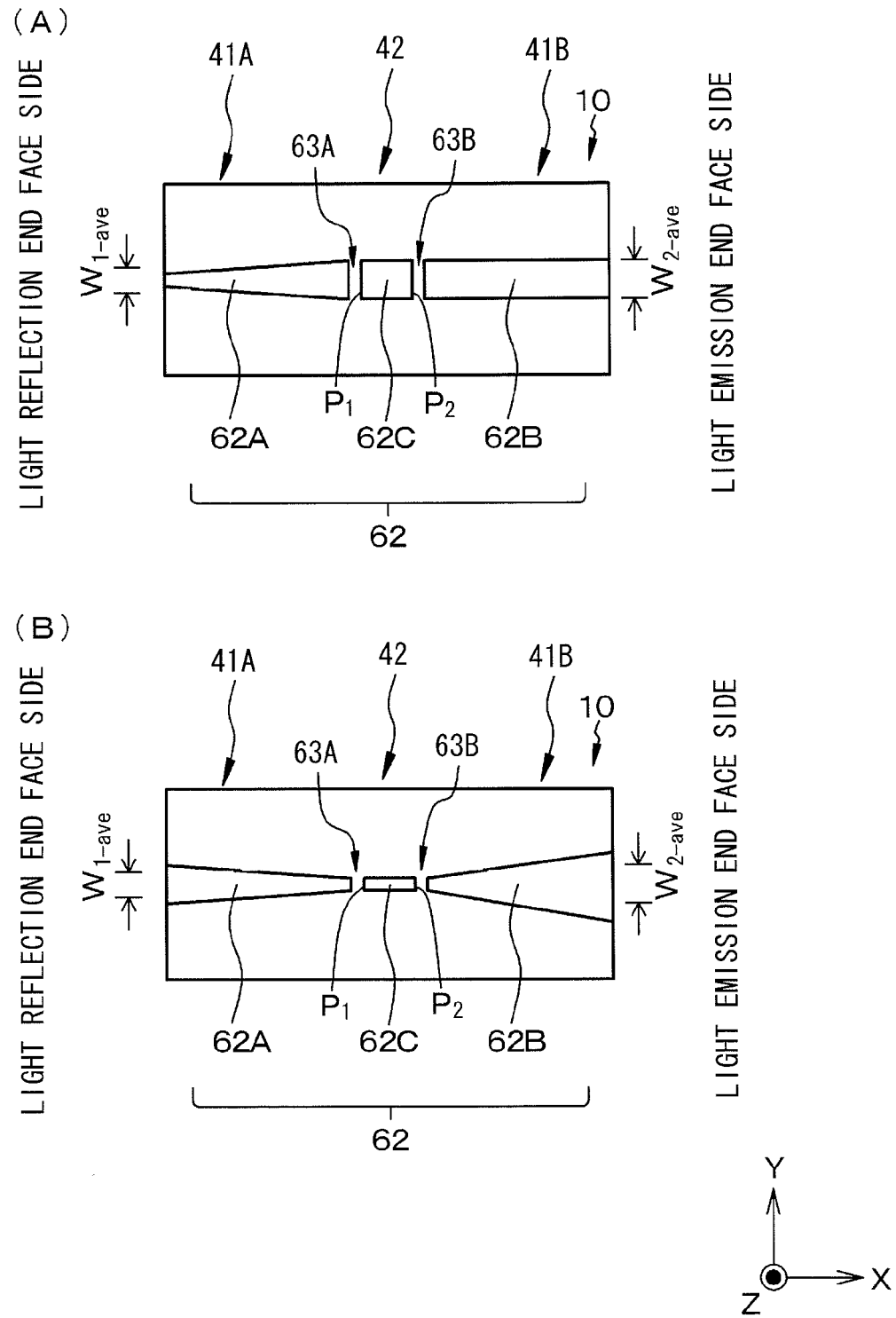
[FIG. 2] Parts (A) and (B) of FIG. 2 are each a schematic plan view of a modification of the semiconductor laser device of Example 1.
Figure 3:
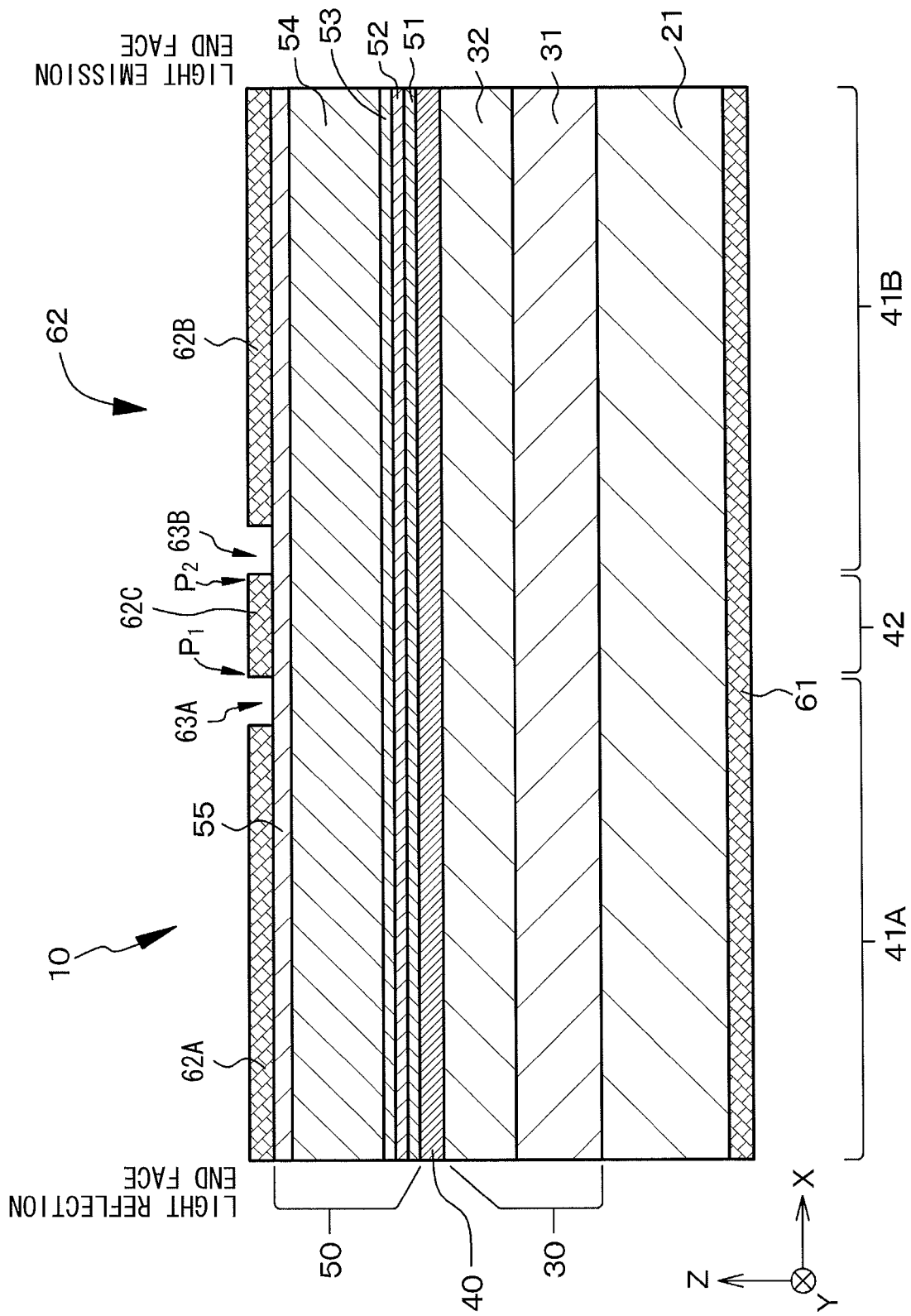
[FIG. 3]
Figure 4:
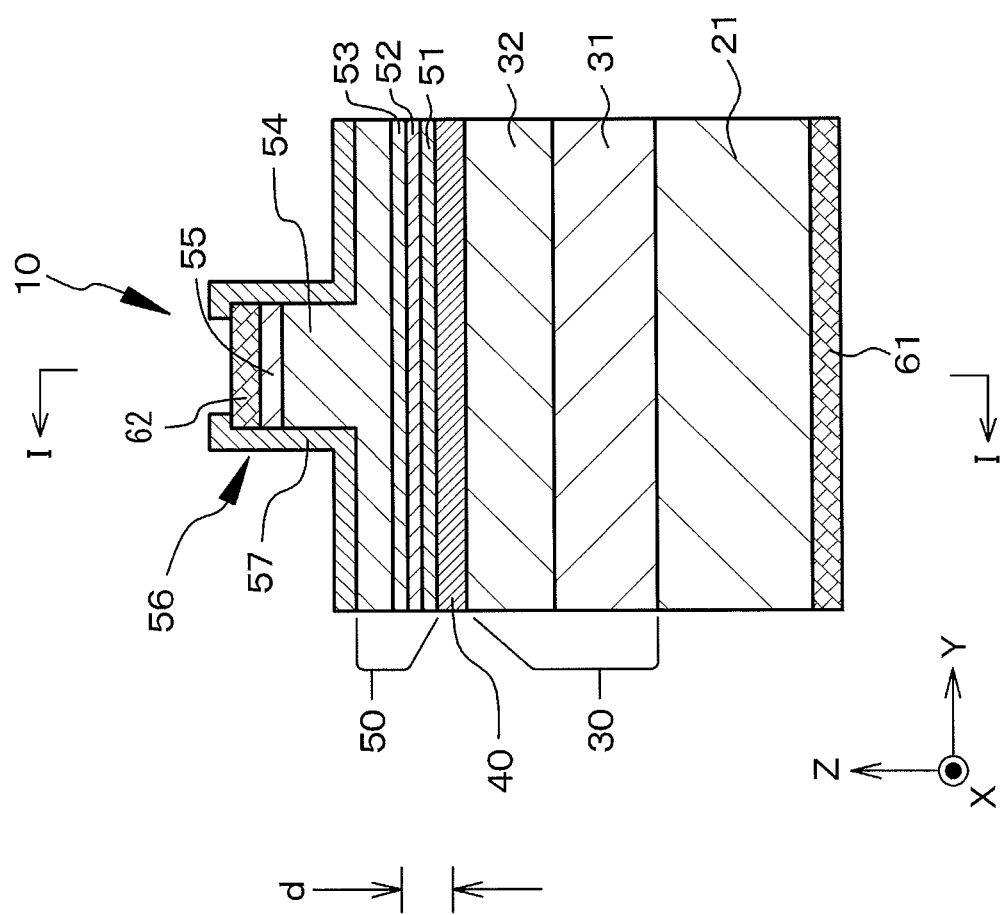
[FIG. 4]

Example 1 relates to the semiconductor laser device according to the first embodiment of the present invention. FIG. 3 is a schematic end-face view (a schematic end-face view taken when the semiconductor laser device is cut in an XZ plane) of the semiconductor laser device of Example 1 along a direction in which a resonator extends. FIG. 4 is a schematic cross-sectional view (a schematic cross-sectional view taken when the semiconductor laser device is cut in a YZ plane) of the semiconductor laser device along a direction orthogonal to the direction in which the resonator extends. It is to be noted that FIG. 3 is a schematic end-face view taken along an arrow I-I in FIG. 4, and FIG. 4 is a schematic cross-sectional view taken along an arrow II-II in FIG. 3. Further, Parts (A) and (B) of FIG. 1 and Parts (A) and (B) of FIG. 2 are each a schematic plan view of the semiconductor laser device of Example 1.

The semiconductor laser device of Example 1 or later-described Example 2 (hereinafter, may be collectively referred to as "semiconductor laser device 10 of Example 1 and the like" in some cases) is configured of a multi-electrode-type semiconductor laser device and has the laser structure of the semiconductor laser device of the present invention. Specifically, the semiconductor laser device 10 of Example 1 and the like is a semiconductor laser device including:

(a) a laminate structure in which a first compound semiconductor layer 30 having a first conductivity type (specifically, the n-type conductivity type in each Example) and being formed of a GaN-based compound semiconductor, a third compound semiconductor layer (active layer) 40 formed of the GaN-based compound semiconductor, the third compound semiconductor layer configuring a first light emission region (gain region) 41A, a second light emission region (gain region) 41B, and a saturable absorption region 42 that is sandwiched by the first light emission region 41A and the second light emission region 41B, and a second compound semiconductor layer 50 having a second conductivity type (specifically, the p-type conductivity type in each Example) that is different from the first conductivity type and being formed of the GaN-based compound semiconductor are laminated in order;

(b) a second electrode 62 formed on the second compound semiconductor layer 50; and (c) a first electrode 61 electrically connected to the first compound semiconductor layer 30, wherein the laminate structure has a ridge stripe structure, the second electrode 62 is configured of a first portion 62A that causes a forward bias state by applying a direct current to the first electrode 61 via the first light emission region 41A, a second portion 62B that causes the forward bias state by applying a direct current to the first electrode 61 via the second light emission region 41B, and a third portion 62C that applies an electric field to the saturable absorption region 42, the first portion 62A of the second electrode 62 is separated from the third portion 62C thereof by a first separation groove 63A, the second portion 62B of the second electrode 62 is separated from the third portion 62C thereof by a second separation groove 63B, and laser light is emitted from an end face on a second light emission region side of the semiconductor laser device.

The laminate structure has a ridge stripe structure 56. Specifically, the semiconductor laser device 10 of Example 1 and the like is a semiconductor laser device that has a separate confinement heterostructure (SCH structure) of a ridge stripe type. More specifically, the semiconductor laser device 10 is a GaN-based semiconductor laser device configured of an index-guide-type AlGaInN developed for a Blu-ray optical disk system. Specifically, the first compound semiconductor layer 30, the third compound semiconductor layer 40, and the second compound semiconductor layer 50 are formed of an AlGaInN-based compound semiconductor, and more specifically, those in the semiconductor laser device 10 of Example 1 and the like may have a layer configuration shown in Table 1 below. Here, in Table 1, a compound semiconductor layer described in lower part is a layer closer to an n-type GaN substrate 21. A band gap of a compound semiconductor configuring a well layer in the third compound semiconductor layer 40 is 3.06 eV. The semiconductor laser device 10 of Example 1 and the like is provided on a (0001) plane of the n-type GaN substrate 21 and the third compound semiconductor layer 40 has a quantum well structure. The (0001) plane of the n-type GaN substrate 21 is also called "C plane" and is a crystal plane having a polarity.

[Table 1]
the second compound semiconductor layer 50
  a p-type GaN contact layer (Mg-doped) 55
  a p-type GaN (Mg-doped)/AlGaN superlattice cladding layer 54
    a p-type AlGaN electron barrier layer (Mg-doped) 53
    a non-doped AlGaN cladding layer 52
    a non-doped GaInN light guide layer 51
the third compound semiconductor layer 40
  a GaInN quantum well active layer
    (well layer: $Ga_{0.92}I_{0.08}N$/barrier layer: $Ga_{0.98}In_{0.02}N$)
the first compound semiconductor layer 30
  an n-type GaN cladding layer 32
  an n-type AlGaN cladding layer 31
here,
  a well layer (two layers) 10.5 nm, non-doped
  a barrier layer (three layers) 14 nm, non-doped Further, part of the p-type GaN contact layer 55 and the p-type GaN/AlGaN superlattice cladding layer 54 is removed by a RIE method, and the ridge stripe structure 56 is formed. A laminate insulating film 57 configured of $SiO_2$/Si is formed on both sides of the ridge stripe structure 56. Incidentally, the $SiO_2$ layer is a lower layer and the Si layer is an upper layer. Here, a difference between an effective refractive index of the ridge stripe structure 56 and an effective refractive index of the laminate insulating film 57 is from $5\times10^{-3}$ to $1\times10^{-2}$ both inclusive, and specifically, is $7\times10^{-3}$. Further, the second electrode (p-side ohmic electrode) 62 is formed on the p-type GaN contact layer 55 corresponding to a top face of the ridge stripe structure 56. On the other hand, the first electrode (n-side ohmic electrode) 61 formed of Ti/Pt/Au is formed on a rear face of the n-type GaN substrate 21.

In the semiconductor laser device 10 of Example 1 and the like, by causing, as far as possible, the p-type AlGaN electron barrier layer 53, the p-type GaN/AlGaN superlattice cladding layer 54, and the p-type GaN contact layer 55 that are Mg-doped compound semiconductor layers not to overlap light density distribution occurred in the third compound semiconductor layer 40 and in the vicinity thereof, internal loss is suppressed in a range in which internal quantum efficiency is not lowered. Further, threshold current density at which laser oscillation is started is thereby reduced. Specifically, a distance d from the third compound semiconductor layer 40 to the p-type AlGaN electron barrier layer 53 was set as 0.10 μm, a height of the ridge stripe structure 56 was set as 0.30 μm, a thickness of the second compound semiconductor layer 50 located between the second electrode 62 and the third compound semiconductor layer 40 was set as 0.50 μm, and a thickness of a portion of the p-type GaN/AlGaN superlattice cladding layer 54 located below the second electrode 62 was set as 0.40 μm.

In the semiconductor laser device 10 of Example 1 and the like, the second electrode 62 is separated into the first portion 62A and the second portion 62B for causing a forward bias state by applying a direct current to the first electrode 61 via the first light emission region (gain region) 41A and the second light emission region (gain region) 41B, and the third portion 62C for applying an electric field to the saturable absorption region 42 (the third portion 62C for applying the reverse bias voltage $V_{sa}$ to the saturable absorption region 42), by the first separation groove 63A and the second separation groove 63B. Here, an electrical resistance value (may be referred to as "separation resistance value" in some cases) between the first portion 62A and the third portion 62C of the second electrode 62 and an electrical resistance value between the second portion 62B and the third portion 63C of the second electrode 62 may be 1×10 times or more of an electrical resistance value between the second electrode 62 and the first electrode 61, and is specifically, $1.5\times10^3$ times thereof. Further, the electrical resistance value (separation resistance value) between the first portion 62A and the third portion 62C of the second electrode 62 and the electrical resistance value between the second portion 62B and the third portion 62C of the second electrode 62 may be $1\times10^2 \Omega$ or larger, and specifically, $1.5\times10^4 \Omega$.

In the semiconductor laser device 10 of Example 1 and the like, laser light is emitted from an end face (light emission end face) on the second light emission region side. On this end face on the second light emission region side, for example, an anti-reflective coating layer (AR) or a low reflective coating layer having reflectance ($r_2$) of 0.5% or lower, preferably, reflectance of 0.3% or lower may be formed. On the other hand, on an end face (which is an end face that faces the light emission end face of the semiconductor laser device 10, and is referred to as "light reflection end face" for the sake of convenience) on the first light emission region side, a high reflective coating layer (HR) having reflectance ($r_1$) of 85% or higher, preferably 95% or higher, is formed. It is to be noted that these anti-reflective coating layer (AR), low reflective coating layer, high reflective coating layer, etc. are not illustrated. Examples of the anti-reflective coating layer or the low reflective coating layer may include a laminate structure including two or more layers selected from a group consisting of a titanium oxide layer, a tantalum oxide layer, a zirconium oxide layer, a silicon oxide layer, and an aluminum oxide layer.

As described above, the second electrode 62 having a separation resistance value of $1 \times 10^2 \Omega$ or larger may be desirably formed on the second compound semiconductor layer 50. In the case of a GaN-based semiconductor laser device, unlike the existing GaAs-based semiconductor laser device, mobility of the compound semiconductor having a p-type conductivity type is small. Therefore, without causing the second compound semiconductor layer 50 having the p-type conductivity type to have high resistance, by ion implantation or the like, it is possible, by separating the second electrode 62 formed thereon by the first separation groove 63A and the second separation groove 63B, to cause the electrical resistance values between the first portion 62A and the third portion 62C of the second electrode 62 and between the second portion 62B and the third portion 62C of the second electrode 62 to be 10 times or more of the electrical resistance value between the second electrode 62 and the first electrode 61, or to cause the electrical resistance values between the first portion 62A and the third portion 62C of the second electrode 62 and between the second portion 62B and the third portion 62C of the second electrode 62 to be $1 \times 10^2 \Omega$ or larger.

In the semiconductor laser device 10 of Example 1, $$1 < W_{2\text{-}ave}/W_{1\text{-}ave} = K$$

is satisfied, and preferably, $$1 < W_{2\text{-}ave}/W_{1\text{-}ave} \leq 4.5$$

may be satisfied, where $W_{1\text{-}ave}$ is an average width of a portion having the ridge stripe structure of the first portion 62A of the second electrode 62, and $W_{2\text{-}ave}$ is an average width of a portion having the ridge stripe structure of the second portion 62B of the second electrode 62. It is to be noted that the determination of $$1 < W_{2\text{-}ave}/W_{1\text{-}ave} \leq 4.5$$

is a result obtained by performing various tests and simulations. Further, in the semiconductor laser device 10 of Example 1, a value of $K \equiv W_{2\text{-}ave}/W_{1\text{-}ave}$ is determined so that $$0.2 \leq I_1/I_2 \leq 4.5$$

is satisfied, and preferably, $$I_1/I_2 = 1.0$$

may be satisfied, where $I_1$ is light intensity of a portion (a first region $P_1$ of the saturable absorption region) of the saturable absorption region 42 corresponding to a region (the first region of the third portion) of the third portion 62C that faces the first portion 62A of the second electrode 62, and $I_2$ is light intensity of a portion (a second region $P_2$ of the saturable absorption region) of the saturable absorption region 42 corresponding to a region (the second region of the third portion) of the third portion 62C that faces the second portion 62B of the second electrode 62. More specifically, in Example 1, $$W_{1\text{-}ave} = 5.0 \,\mu\text{m}$$

$$W_{2\text{-}ave} = 7.5 \,\mu\text{m}$$

$$K = 1.50$$

were satisfied. It is to be noted that detailed description will be given later for a value of K.

Here, in the semiconductor laser device 10 illustrated in the schematic plan view in Part (A) of FIG. 1, a planar shape of the first portion 62A of the second electrode 62 is a strip-like shape having a constant width, a planar shape of the second portion 62B is also a strip-like shape having a constant width, and a planar shape of the third portion 62C is also a strip-like shape having a constant width. A width of the ridge stripe structure corresponding to the second portion 62B is equal to a width of the ridge stripe structure corresponding to the third portion 62C, and a width of the ridge stripe structure corresponding to the first portion 62A is larger than the width of the ridge stripe structure corresponding to the third portion 62C.

On the other hand, in the semiconductor laser device 10 illustrated in the schematic plan view in Part (B) of FIG. 1, the planar shape of the first portion 62A of the second electrode 62 is a strip-like shape having a constant width and the planar shape of the third portion 62C is also a strip-like shape having a constant width. However, the planar shape of the second portion 62B is a tapered shape, and a width thereof is largest on the light emission end face side, is decreased toward the third portion 62C, and is smallest at a portion that faces the third portion 62C. The width of the ridge stripe structure corresponding to the first portion 62A is equal to the width of the ridge stripe structure corresponding to the third portion 62C, and the width of the ridge stripe structure corresponding to a portion of the second portion 62B that faces the third portion 62C is equal to the width of the ridge stripe structure corresponding to the third portion 62C.

Moreover, in the semiconductor laser device 10 illustrated in the schematic plan view in Part (A) of FIG. 2, the planar shape of the second portion 62B of the second electrode 62 is a strip-like shape having a constant width and the planar shape of the third portion 62C is also a strip-like shape having a constant width. However, the planar shape of the first portion 62A is a tapered shape, and a width thereof is smallest on the light reflection end face side, is increased toward the third portion 62C, and is largest at a portion that faces the third portion 62C. The width of the ridge stripe structure corresponding to the second portion 62B is equal to the width of the ridge stripe structure corresponding to the third portion 62C, and the width of the ridge stripe structure corresponding to the portion of the first portion 62A that faces the third portion 62C is equal to the width of the ridge stripe structure corresponding to the third portion 62C.

Moreover, in the semiconductor laser device 10 illustrated in the schematic plan view in Part (B) of FIG. 2, the planar shape of the third portion 62C is a strip-like shape having a constant width. However, the planar shape of the second portion 62B is a tapered shape, and a width thereof is largest on the light emission end face side, is decreased toward the third portion 62C, and is smallest at the portion that faces the third portion 62C. Also, the planar shape of the first portion 62A is a tapered shape, and the width thereof is largest on the light reflection end face side, is decreased toward the third portion 62C, and is smallest at the portion that faces the third portion 62C. The width of the ridge stripe structure corresponding to the portion of the first portion 62A that faces the third portion 62C is equal to the width of the ridge stripe structure corresponding to the third portion 62C, and the width of the ridge stripe structure corresponding to the portion of the second portion 62B that faces the third portion 62C is equal to the width of the ridge stripe structure corresponding to the third portion 62C.

Moreover, in the semiconductor laser device 10 according to Example 1, $$0.2 \leq K_1/K_2 \leq 4.5$$

is satisfied, and preferably, $$K_1/K_2 = 1.0$$

may be satisfied where $K_1$ and $K_2$ are set as follows.

$$K_1 \equiv \exp[g(x \cdot L_0 - L_{sa}/2)] + r_2 \cdot \exp[g(x \cdot L_0 - L_{sa}/2) - 2 \cdot \alpha \cdot L_{sa} + 2 \cdot K \cdot g\{(1-x)L_0 - L_{sa}/2\}]$$

$$K_2 \equiv \exp[g(x \cdot L_0 - L_{sa}/2) - \alpha \cdot L_{sa}] + r_2 \cdot \exp[g(x \cdot L_0 - L_{sa}/2) - \alpha \cdot L_{sa} + 2 \cdot K \cdot g\{(1-x)L_0 - L_{sa}/2\}]$$

Further, a value of an absorption coefficient $\alpha$ of the saturable absorption region 42 satisfies $$0 \text{ cm}^{-1} < \alpha \leq 5000 \text{ cm}^{-1},$$

and may preferably satisfy $$500 \text{ cm}^{-1} \leq \alpha \leq 4000 \text{ cm}^{-1}.$$

Specifically, in Example 1, $$\alpha = 1000 \text{ cm}^{-1}$$

was satisfied.

It is to be noted that g and K are as follows, $$g = [2\{x + K(1-x)L_0\} - L_{sa}(1+K)]^{-1} \cdot \ln[1/\{r_1 \cdot r_2 \cdot \exp(-2 \cdot \alpha \cdot L_{sa})\}]$$

$$K \equiv W_{2-ave}/W_{1-ave}$$

where $L_0$: a distance from an end face on a first light emission region side to the end face on the second light emission region side
x: a value ($L_{sa}/L_0$) obtained by normalizing a distance $L_{sa}$ from the end face on the first light emission region side to a center of the saturable absorption region 42 by $L_0$, 0<x<1
$L_{sa}$: a length of the saturable absorption region 42
$r_1$: light reflectance of the end face on the first light emission region side
$r_2$: light reflectance of the end face on the second light emission region side
$\alpha$: an absorption coefficient of the saturable absorption region 42.

Figure 5:
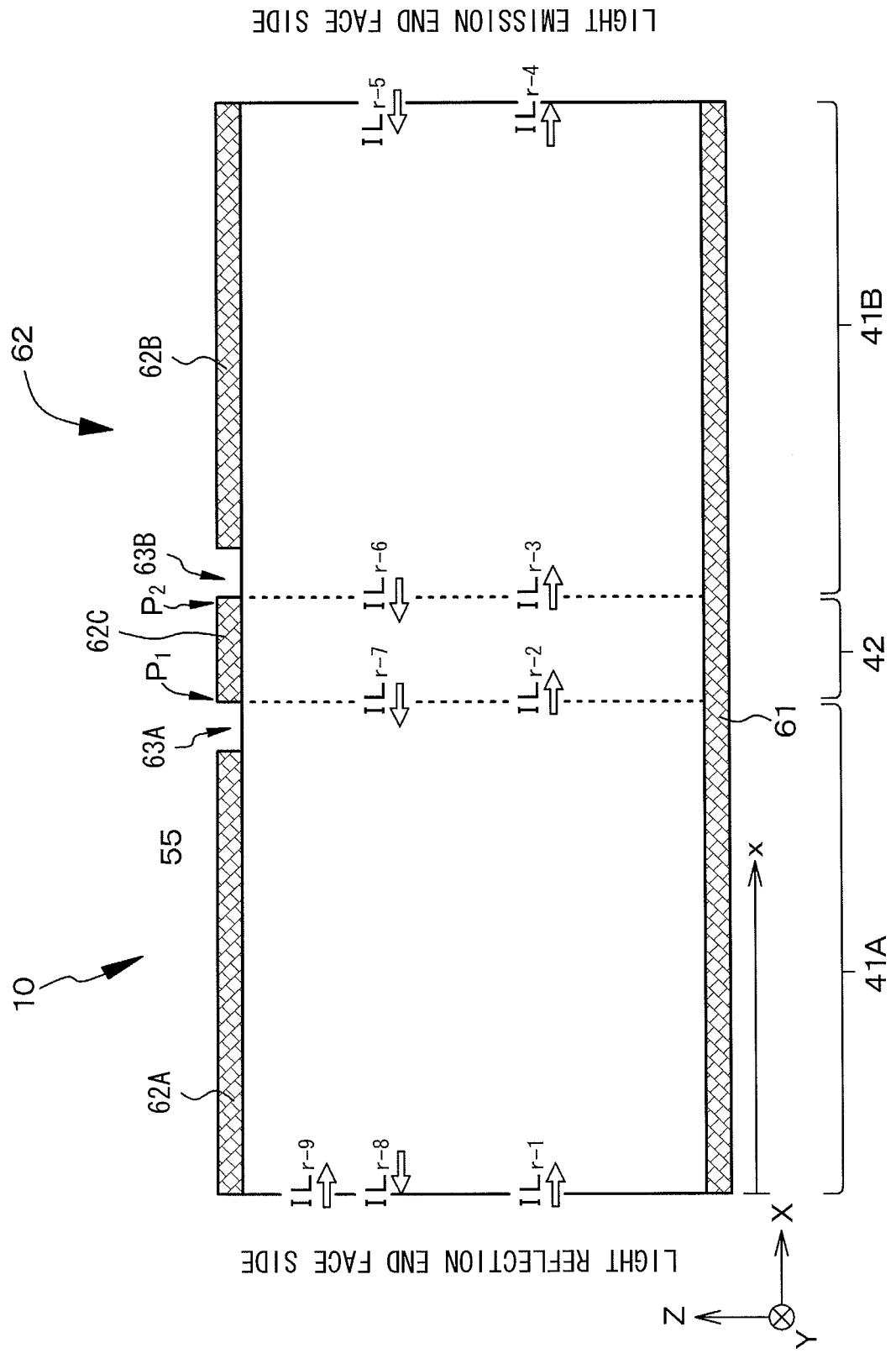
[FIG. 5]

Description will be given below of $K_1$ and $K_2$. In order to consider a reason of degradation in the semiconductor laser device, light intensity at a position of each portion inside the semiconductor laser device is calculated with the use of a model shown in FIG. 5. Here, light intensity of each portion is defined as follows. It is to be noted that the same is applied to Example 2 which will be described later.

light intensity $IL_{r-1}$ . . . light intensity of light of the end face on the first light emission region side that travels toward the second light emission region light intensity $IL_{r-2}$ . . . light intensity of light at a boundary of the first light emission region 41A and the saturable absorption region 42 that travels toward the second light emission region light intensity $IL_{r-3}$ . . . light intensity of light at a boundary of the saturable absorption region 42 and the second light emission region 41B that travels toward the second light emission region light intensity $IL_{r-4}$ . . . light intensity of light that has collided with the end face on the second light emission region side light intensity $IL_{r-5}$ . . . light intensity of light that is reflected by the end face on the second light emission region side and travels toward the first light emission region light intensity $IL_{r-6}$ . . . light intensity of light at a boundary of the second light emission region 41B and the saturable absorption region 42 that travels toward the first light emission region light intensity $IL_{r-7}$ . . . light intensity of light at a boundary of the saturable absorption region 42 and the first light emission region 41A that travels toward the first light emission region light intensity $IL_{r-8}$ . . . light intensity of light that has collided with the end face on the first light emission region side light intensity $IL_{r-9}$ . . . light intensity of light that is reflected by the end face on the first light emission region side and travels again toward the second light emission region Here, when $$\text{light intensity } IL_{r-1} = 1.00,$$

the light intensity $IL_{r-2}$, the light intensity $IL_{r-3}$, the light intensity $IL_{r-4}$, the light intensity $IL_{r-5}$, the light intensity $IL_{r-6}$, the light intensity $IL_{r-7}$, the light intensity $IL_{r-8}$, and the light intensity $IL_{r-9}$ are expressed as follows. It is to be noted that the light intensity is calculated where a gain in the second light emission region 41B is K times ($K \equiv W_{2-ave}/W_{1-ave}$) of a gain g in the first light emission region 41A.

As described above, when light propagates a distance D, the light intensity is amplified or attenuated to $\exp(g \cdot D)$ in the first light emission region 41A, to $\exp(g \cdot K \cdot D)$ in the second light emission region 41B, and to $\exp(-\alpha \cdot D)$ in the saturable absorption region 42 where g is the gain in the first light emission region 41A and g·K is the gain in the second light emission region 41B. Therefore, the light intensity is as follows.

$$IL_{r-1} = 1.00$$

$$IL_{r-2} = \exp[g(x \cdot L_0 - L_{sa}/2)]$$

$$IL_{r-3} = \exp[g(x \cdot L_0 - L_{sa}/2) - \alpha \cdot L_{sa}]$$

$$IL_{r-4} = \exp[g(x \cdot L_0 - L_{sa}/2) - \alpha \cdot L_{sa} + K \cdot g\{(1-x)L_0 - L_{sa}/2\}]$$

$$IL_{r-5} = r_2[\exp[g(x \cdot L_0 - L_{sa}/2) - \alpha \cdot L_{sa} + K \cdot g\{(1-x)L_0 - L_{sa}/2\}]]$$

$$IL_{r-6} = r_2[\exp[g(x \cdot L_0 - L_{sa}/2) - \alpha \cdot L_{sa} + 2 \cdot K \cdot g\{(1-x)L_0 - L_{sa}/2\}]]$$

$$IL_{r-7} = r_2[\exp[g(x \cdot L_0 - L_{sa}/2) - 2 \cdot \alpha \cdot L_{sa} + 2 \cdot K \cdot g\{(1-x)L_0 - L_{sa}/2\}]]$$

$$IL_{r-8} = r_2[\exp[2 \cdot g(x \cdot L_0 - L_{sa}/2) - 2 \cdot \alpha \cdot L_{sa} + 2 \cdot K \cdot g\{(1-x)L_0 - L_{sa}/2\}]]$$

$$IL_{r-9} = r_1 \cdot r_2[\exp[2 \cdot g(x \cdot L_0 - L_{sa}/2) - 2 \cdot \alpha \cdot L_{sa} + 2 \cdot K \cdot g\{(1-x)L_0 - L_{sa}/2\}]]$$

Here, light intensity of the first region $P_1$ of the saturable absorption region is ($IL_{r-2} + IL_{r-7}$) and light intensity of the second region $P_2$ of the saturable absorption region is ($IL_{r-3} + IL_{r-6}$). Further, in order to satisfy ($IL_{r-2} + IL_{r-7}$) = ($IL_{r-3} + IL_{r-6}$), various parameters, specifically, values of K, $\alpha$, x, g, $r_1$, $r_2$, $L_0$, and $L_{sa}$ may be determined and adjusted so that the following is satisfied.

$$\exp[g(x \cdot L_0 - L_{sa}/2)] + r_2[\exp[g(x \cdot L_0 - L_{sa}/2) - 2 \cdot \alpha \cdot L_{sa} + 2 \cdot K \cdot g\{(1-x)L0 - L_{sa}/2\}] = \exp[g(x \cdot L_0 - L_{sa}/2) - \alpha \cdot L_{sa}] + r_2[\exp[g(x \cdot L_0 - L_{sa}/2) - \alpha \cdot L_{sa} + 2 \cdot K \cdot g\{(1-x)L_0 - L_{sa}/2\}] \quad [A]$$

Here, the absorption coefficient α of the saturable absorption region is a parameter that may be varied due to the reverse bias voltage $V_{sa}$ that is applied to the saturable absorption region 42. α=0 refers to a state in which light is not absorbed by the compound semiconductor layer and is not amplified. The values of g, $r_1$, $r_2$, $L_0$, and $L_{sa}$ are often determined unambiguously depending on a design spec of the semiconductor laser device. Therefore, K or x may be determined so that the above-described expression [A] is satisfied. In Example 1, by determining the value of K, in other words, by determining the gain g in the first light emission region 41A and the gain g·K in the second light emission region 41B, and in Example 2 which will be described later, by determining the value of x, the above-described expression [A] or a later-described expression [B] is satisfied.

Further, gain coefficients of the first light emission region (gain region) 41A and the second light emission region (gain region) 41B are expressed as in the above expression based on an oscillation condition at the time of oscillation, $$IL_{r-1}=IL_{r-9}.$$

Figure 6:
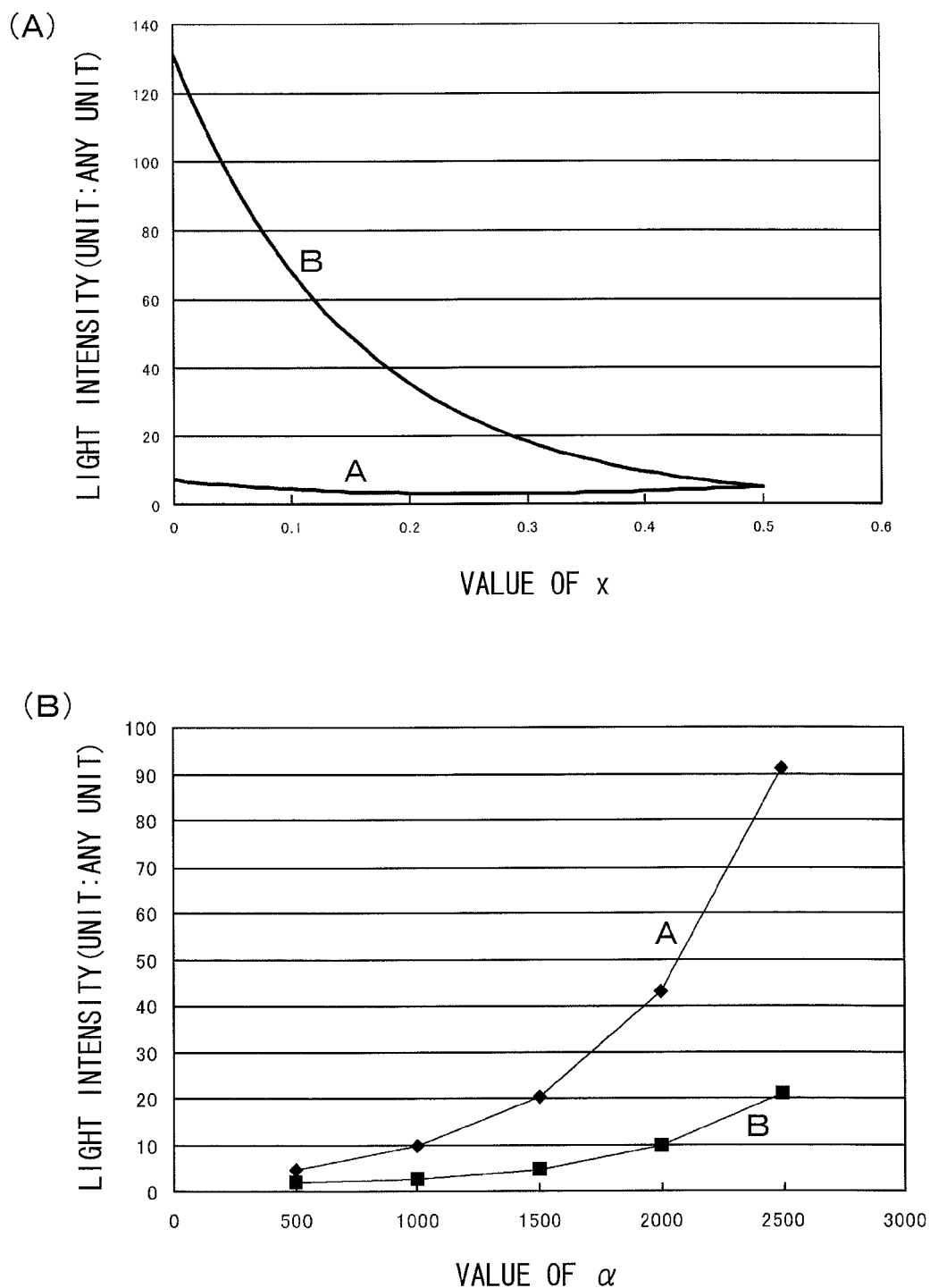
[FIG. 6] Part (A) of FIG. 6 is a graph illustrating a relationship between a value of each of light intensity ($IL_2 + IL_7$) and light intensity ($IL_3 + IL_6$) and a value of x in the semiconductor laser device of Example 1. Part (B) of FIG. 6 is a graph illustrating a relationship between α and light intensity in the first light emission region and a relationship between α and light intensity in the second light emission region.

Here, a value of $(IL_{r-2}+IL_{r-7})$ (illustrated as a curve line "A") and a value of $(IL_{r-3}+IL_{r-6})$ (illustrated as a curve line "B") are illustrated in Part (A) of FIG. 6 where $L_0$=600 μm
$L_{sa}$=30 μm
α=1000 cm$^{-1}$
$r_1$=80%
$r_2$=20%
x=0.5.

In Part (A) of FIG. 6, a lateral axis indicates the value of x and the vertical axis indicates the light intensity (unit may be any unit).

Moreover, a relationship (illustrated as a curve line "A") between α and the light intensity in the first light emission region 41A and a relationship (illustrated as a curve line "B") between α and the light intensity in the second light emission region 41B are illustrated in Part (B) of FIG. 6 where K=1. In Part (B) of FIG. 6, a lateral axis indicates the value of α and the vertical axis indicates the light intensity (unit may be any unit). It is to be noted that x=0.5. As can be seen from Part (B) of FIG. 6, irrespective of the value of α, the value of the light intensity of the first light emission region 41A is higher than the value of the light intensity of the second light emission region 41B. This is caused by a fact that the light reflectance $r_1$ of the end face on the first light emission region side has a value higher than that of the light reflectance $r_2$ of the end face on the second light emission region side.

Various values of $(IL_{r-2}+IL_{r-7})$ and $(IL_{r-3}+IL_{r-6})$ similar to those shown in Part (A) of FIG. 6 are obtained using the value of K as a parameter. Here, values shown in Part (A) of FIG. 6 are values of the light intensity at K=1.50 (=$K_0$) when x=0.5. When K=$K_0$=1.50, the gain g in the first light emission region 41A is equal to the gain g·K in the second light emission region 41B, and the light intensity [the value of $(IL_{r-2}+IL_{r-7})$] of the first region $P_1$ of the saturable absorption region is equal to the light intensity [the value of $(IL_{r-3}+IL_{r-6})$] of the second region $P_2$ of the saturable absorption region. It is to be noted that, from Part (A) of FIG. 6, for example, when x=0.3, a value of $(IL_{r-3}+IL_{r-6})/(IL_{r-2}+IL_{r-7})$ is 5.21. Further, when K<$K_0$, for example, when x=0.5 and K=1.0, $(IL_{r-3}+IL_{r-6})/(IL_{r-2}+IL_{r-7})$=0.54. On the contrary, when K>$K_0$, for example, when x=0.5 and K=2.0, $(IL_{r-3}+IL_{r-6})/(IL_{r-2}+IL_{r-7})$=1.74.

In such a manner, in the semiconductor laser device 10 of Example 1, the value of K≡$W_{2-ave}/W_{1-ave}$ is determined, in other words, K≡$W_{2-ave}/W_{1-ave}$>1 is satisfied. Therefore, the light intensity $(IL_{r-2}+IL_{r-7})$ of the first region of the saturable absorption region is substantially equal to or is equal to the light intensity $(IL_{r-3}+IL_{r-6})$ of the second region of the saturable absorption region. Therefore, an occurrence of a phenomenon that the light intensity of the first region of the saturable absorption region becomes excessively high is suppressed, and therefore, damage is less likely to be caused in the first region of the saturable absorption region. Moreover, an electric field is less likely to be concentrated on the first region of the third portion of the second electrode. In other words, an electric field in the first region of the third portion is substantially equal to or is equal to an electric field in the second region of the third portion. Therefore, damage is less likely to be caused in the third portion of the second electrode. Moreover, as a result of an electric filed being less likely to be concentrated on the boundary region of the saturable absorption region, light density is allowed to be reduced, and therefore, damage is less likely to be caused in the boundary region of the saturable absorption region.

Characteristics that is desired in the second electrode 62 are as follows.

(1) The second electrode has a function of serving as an etching mask upon etching the second compound semiconductor layer 50.

(2) The second electrode 62 is capable of being wet-etched without causing degradation in optical or electric characteristics of the second compound semiconductor layer 50.

(3) The second electrode has a contact specific resistance value of $10^{-2}$ Ω·cm$^2$ or smaller when it is formed on the second compound semiconductor layer 50.

(4) When the second electrode is a laminate structure, a material configuring the lower metal layer has a large work function, has a low contact specific resistance value with respect to the second compound semiconductor layer 50, and is capable of being wet-etched.

(5) When the second electrode is a laminate structure, a material configuring the upper metal layer has tolerance with respect to etching at the time of forming the ridge stripe structure (for example, $Cl_2$ gas used in a RIE method), and is capable of being wet-etched.

In the semiconductor laser device 10 of Example 1 and the like, the second electrode 62 was configured of a Pd single layer with a thickness of 0.1 μm.

It is to be noted that a thickness of the p-type GaN/AlGaN superlattice cladding layer 54 having a superlattice structure in which p-type GaN layers and p-type AlGaN layers are alternately laminated is 0.7 μm or smaller, specifically, is 0.4 μm. A thickness of the p-type GaN layer configuring the superlattice structure is 2.5 nm. A thickness of the p-type AlGaN layer configuring the superlattice structure is 2.5 nm. The total number of layer of the p-type GaN layers and the p-type AlGaN layers is 160. Further, the distance from the third compound semiconductor layer 40 to the second electrode 62 is 1 μm or smaller, and specifically, is 0.5 μm. Further, the p-type AlGaN electron barrier layer 53, the p-type GaN/AlGaN superlattice cladding layer 54, and the p-type GaN contact layer 55 that configure the second compound semiconductor layer 50 are doped with Mg of 1×10$^{19}$ cm$^{-3}$ or more (specifically, 2×10$^{19}$ cm$^{-3}$). The absorption coefficient of the second compound semiconductor layer 50 with respect to light having a wavelength of 405 nm is 50 cm$^{-1}$ or larger, and specifically, is 65 cm$^{-1}$. Further, the second compound semiconductor layer 50 includes a non-doped compound semiconductor layers (the non-doped GaInN light guide layer 51 and the non-doped AlGaN cladding layer 52) and the p-type compound semiconductor layer from the third compound semiconductor layer side. The distance (d) from the third compound semiconductor layer 40 to the p-type compound semiconductor layer (specifically, the p-type AlGaN electron barrier layer 53) is $1.2 \times 10^{-7}$ m or smaller, and specifically, is 100 nm.

Figure 11:
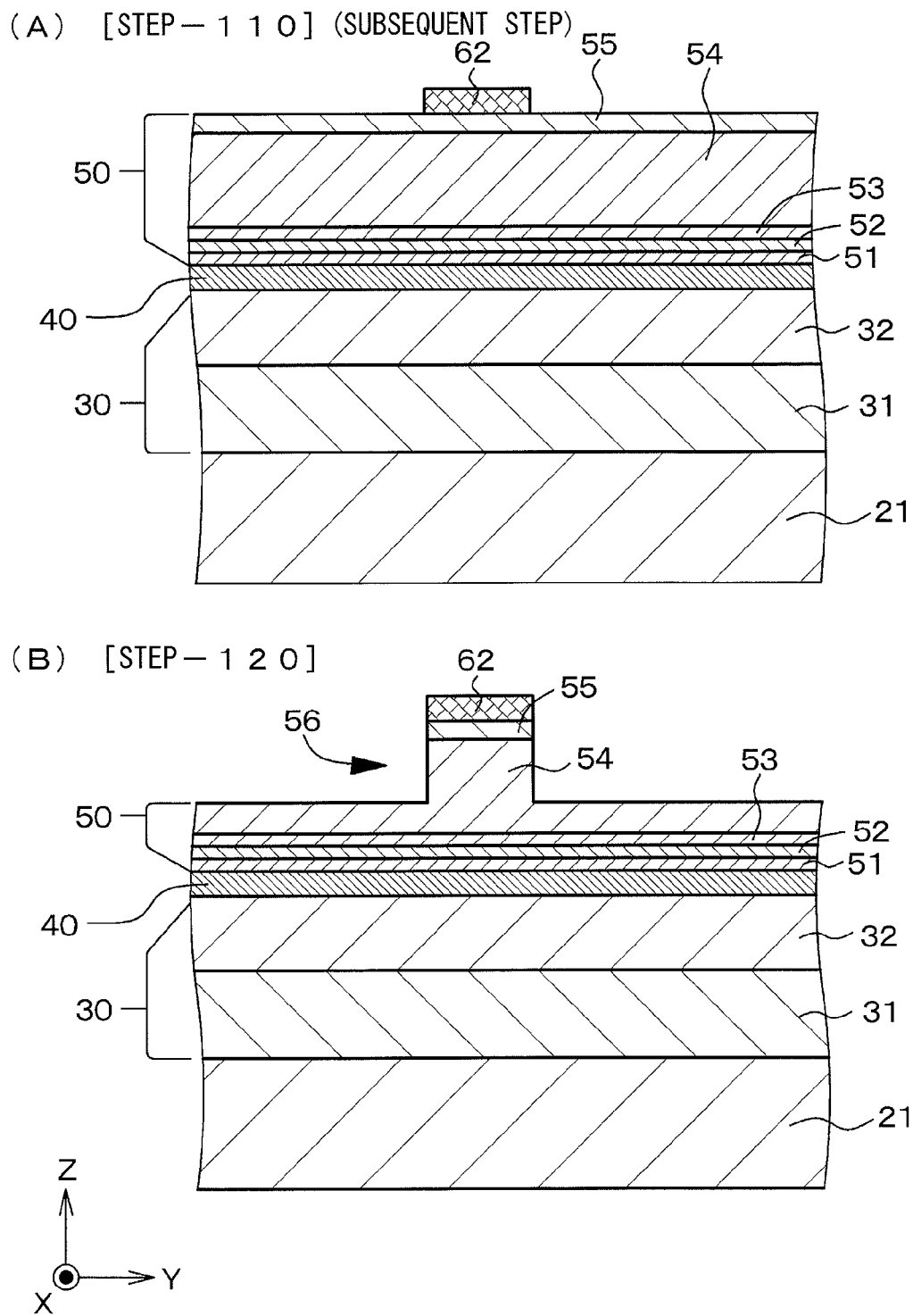
[FIG. 11] Parts (A) and (B) of FIG. 11 are each a schematic partial cross-sectional view of the substrate etc. for describing the method of manufacturing the semiconductor laser device of Example 1, following Part (B) of FIG. 10.
Figure 12:
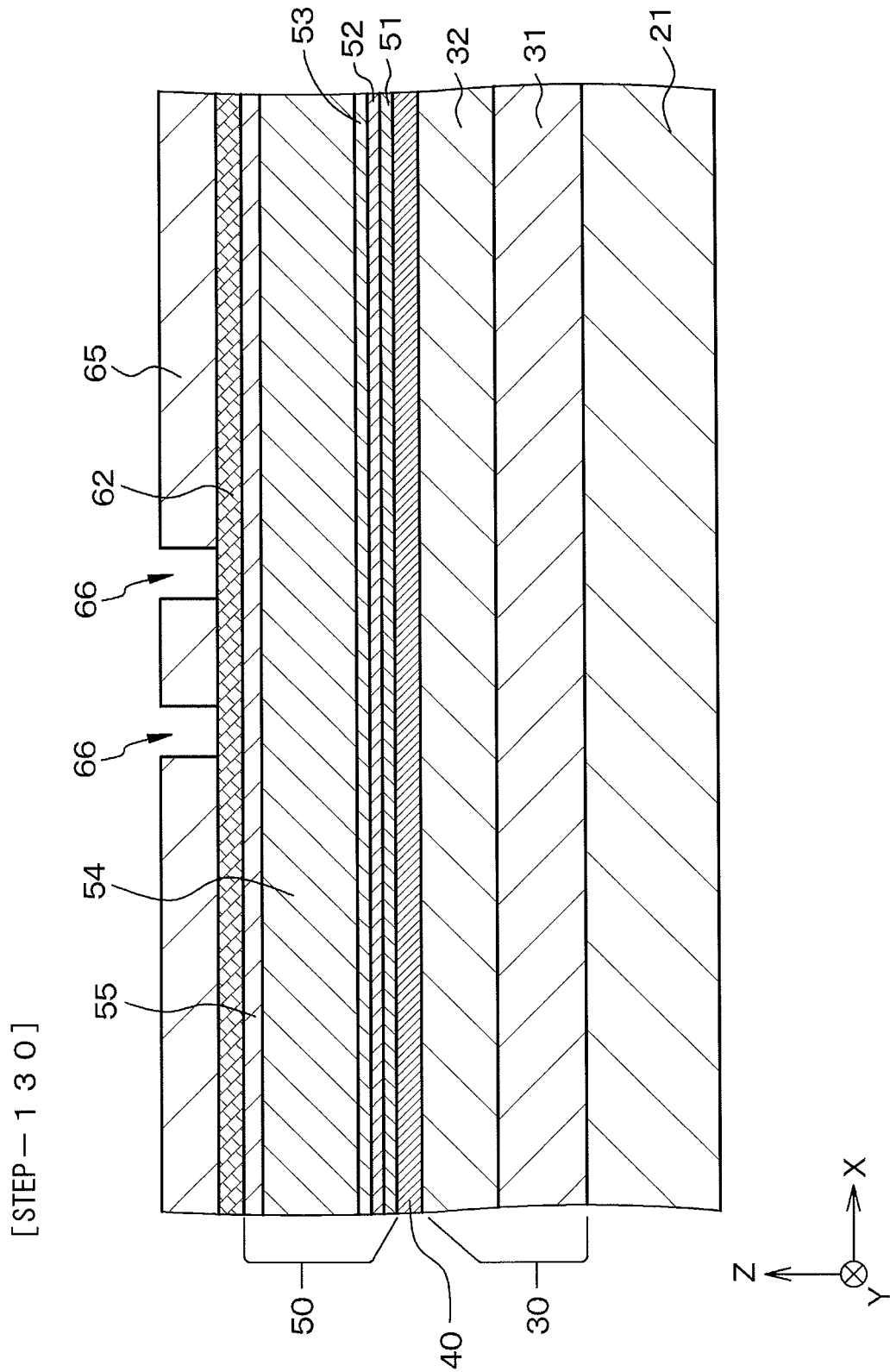
[FIG. 12]

Description will be given below of a method of manufacturing the semiconductor laser device 10 of Example 1 with reference to Parts (A) and (B) of FIG. 10, Parts (A) and (B) of FIG. 11, and FIG. 12. It is to be noted that Parts (A) and (B) of FIG. 10 and Parts (A) and (B) of FIG. 11 are each a schematic partial cross-sectional view when the substrate etc. are cut at the YZ plane, and FIG. 12 is a schematic partial cross-sectional view when the substrate etc. are cut at the XZ plane.

[Step-100]

Figure 10:
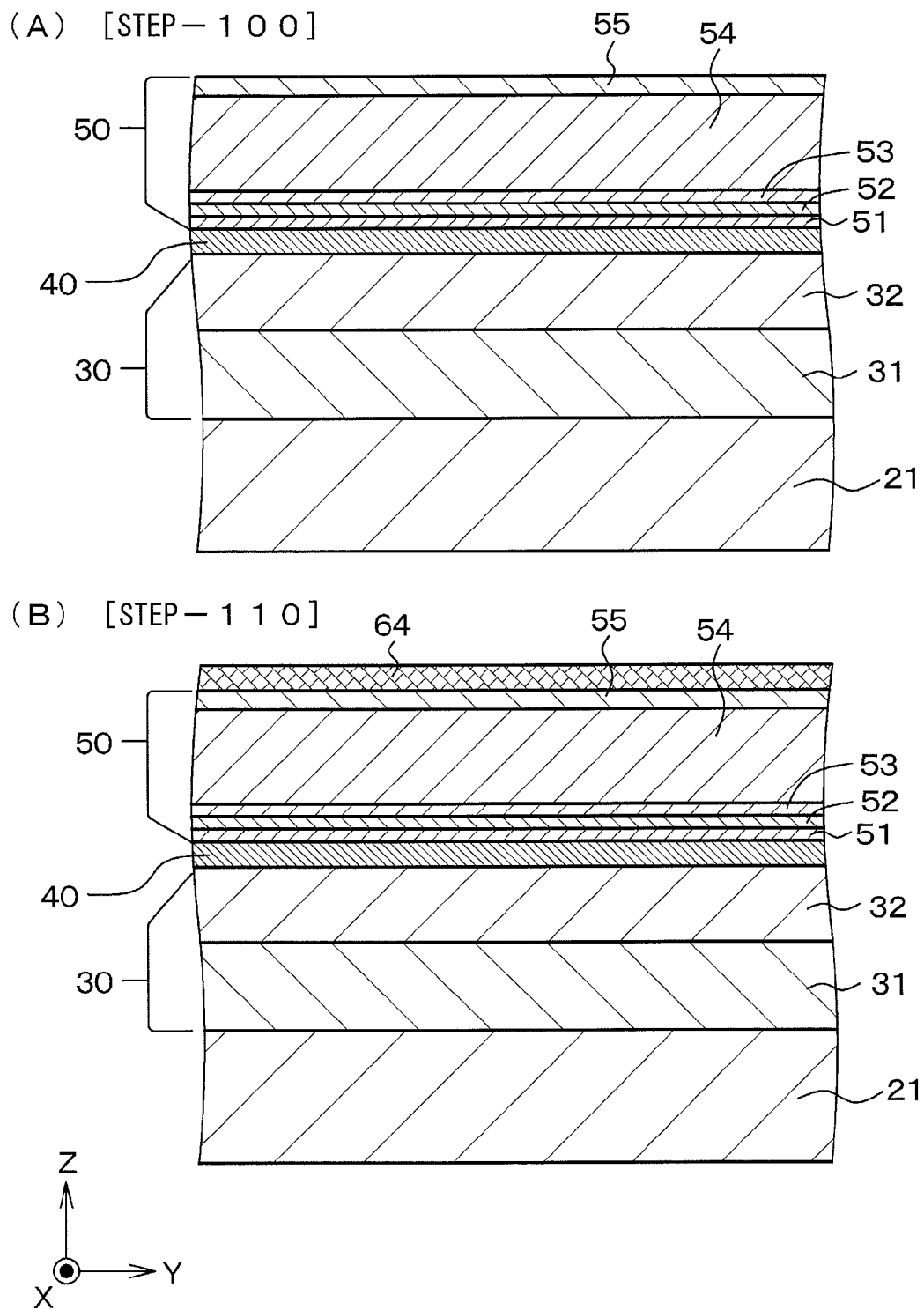
[FIG. 10] Parts (A) and (B) of FIG. 10 are each a schematic partial cross-sectional view of a substrate etc. for describing a method of manufacturing the semiconductor laser device of Example 1.

First, on the substrate, specifically, on the (0001) plane of the n-type GaN substrate 21, a laminate structure is formed in which the first compound semiconductor layer 30 that has the first conductivity type (n-type conductivity type) and is formed of the GaN-based compound semiconductor, the third compound semiconductor layer (active layer) 40 that configures the light emission regions (gain regions) 41A and 41B and the saturable absorption region 42 and is configured of the GaN-based compound semiconductor, and the second compound semiconductor layer 50 that has the second conductivity type (p-type conductivity type) different from the first conductivity type and is configured of the GaN-based compound semiconductor are laminated in order (see Part (A) of FIG. 10).

[Step-110]

Subsequently, the second electrode 62 is formed on the second compound semiconductor layer 50. Specifically, after forming a Pd layer 64 on an entire surface by a vacuum deposition method (see Part (B) of FIG. 10), a resist layer for etching is formed on the Pd layer 64 by a photolithography technique. After removing the Pd layer 64 that is not covered with the etching resist layer with the use of aqua regia, the etching resist layer is removed. Thus, a structure shown in Part (A) of FIG. 11 is obtained. It is to be noted that the second electrode 62 may be formed on the second compound semiconductor layer 50 by a lift-off method.

[Step-120]

Subsequently, part or all of the second compound semiconductor layer 50 is etched with the use of the second electrode 62 as an etching mask (specifically, part of the second compound semiconductor layer 50 is etched) to form the ridge stripe structure 56. Specifically, by a RIE method using $Cl_2$ gas, part of the second compound semiconductor layer 50 is etched with the use of the second electrode 62 as an etching mask. Thus, a structure shown in Part (B) of FIG. 11 is obtained. Since the ridge stripe structure 56 is formed by a self-alignment scheme with the use of the patterned second electrode 62 as the etching mask in such a manner, misalignment between the second electrode 62 and the ridge stripe structure 56 is not caused.

[Step-130]

Subsequently, a resist layer 65 for forming the first separation groove 63A and the second separation grove 63B in the second electrode 62 is formed (see FIG. 12). It is to be noted that a referential number 66 indicates an opening provided in the resist layer 65 in order to form the first separation groove 63A and the second separation groove 63B. Subsequently, the first separation groove 63A and the second separation groove 63B are formed in the second electrode 62 by a wet etching method with the use of the resist layer 65 as a wet-etching mask. Thus, the second electrode 62 is separated into the first portion 62A and the third portion 62C by the first separation groove 63A, and the second electrode 62 is separated into the second portion 62B and the third portion 62C by the second separation groove 63B. Specifically, aqua regia is used as an etchant. The whole is immersed in the aqua regia for about 10 seconds, and thereby, the first separation groove 63A and the second separation groove 63B are formed in the second electrode 62. Subsequently, the resist layer 65 is removed. Thus, a structure shown in FIGS. 3 and 4 is obtained. In such a manner, by adopting the wet etching method, unlike a dry etching method, degradation is not caused in the optical or electric characteristics of the second compound semiconductor layer 50. Therefore, degradation is not caused in the light emission characteristics of the semiconductor laser device. It is to be noted that, when the dry etching method is adopted, internal loss$_{\alpha}$ of the second compound semiconductor layer 50 may be increased, and therefore, a threshold voltage may be increased or light output may be lowered. Here, $ER_0/ER_1 \approx 1 \times 10^2$ is satisfied where $ER_0$ is the etching rate of the second electrode 62 and $ER_1$ is the etching rate of the laminate structure. As described above, since a high etching selection ratio exists between the second electrode 62 and the second compound semiconductor layer 50, the second electrode 62 is allowed to be surely etched without etching the laminate structure (or the laminate structure may be etched only slightly even if the laminate structure is etched). It is to be noted that $ER_0/ER_1 \geq 1 \times 10$ may desirably be satisfied, and, $ER_0/ER_1 \geq 1 \times 10^2$ may preferably be satisfied.

The second electrode 62 may have a laminate structure including a lower metal layer formed of palladium (Pd) with a thickness of 20 nm and an upper metal layer formed of nickel (Ni) with a thickness of 200 nm. Here, upon the wet etching with the use of the aqua regia, the etching rate of nickel is about 1.25 times the etching rate of palladium.

[Step-140]

Subsequently, forming of the n-side electrode, cleavage of the substrate, etc. are performed, and further, packaging is performed. Thus, the semiconductor laser device 10 is fabricated.

In general, resistance R (Ω) of the semiconductor layer is expressed as follows with the use of a specific resistance value ρ (Ω·m) of the material configuring the semiconductor layer, a length $X_0$ (m) of the semiconductor layer, a cross-sectional area S (m$^2$) of the semiconductor layer, carrier density n (cm$^{-3}$), an electric charge amount e (C), and mobility μ (m$^2$/V second).

$$R = (\rho \cdot X_0)/S$$
$$= X_0/(n \cdot e \cdot \mu \cdot S)$$

The mobility of the p-type GaN-based semiconductor is smaller by two digits compared to that of the p-type GaAs-based semiconductor. Therefore, an electrical resistance value thereof is likely to be high. Therefore, it can be seen from the foregoing expression that an electrical resistance value of the semiconductor laser device that has the ridge stripe structure having a small cross-section is a large value.

As a result of measuring, by a four-terminal method, the electrical resistance values between the second portion 62A and the third portion 62B of the second electrode 62 of the manufactured semiconductor laser device 10, and between the first portion 62A and the third portion 62C of the second electrode 62, when the width of the first separation groove 63A and the second separation groove 63B is 20 μm, the electrical resistance values between the first portion 62A and the third portion 62C of the second electrode 62 and between the second portion 62B and the third portion 62C of the second electrode 62 were 15 kΩ. Further, in the manufactured semiconductor laser device 10, self-pulsation operation was allowed to be performed by applying a direct current from the first portion 62A and the second portion 62B of the second electrode 62 to the first electrode 61 via the first light emission region 41A and the second light emission region 41B to cause the forward bias state, and applying the reverse bias voltage $V_{sa}$ between the first electrode 61 and the third portion 62C of the second electrode 62 to apply an electric field to the saturable absorption region 42. In other words, the electrical resistance values between the first portion 62A and the third portion 62C of the second electrode 62 and between the second portion 62B and the third portion 62C of the second electrode 62 are 10 times or larger of the electrical resistance value between the second electrode 62 and the first electrode 61, or are $1\times10^2 \Omega$ or larger. Accordingly, the flow of the leakage current from the first portion 62A to the third portion 62C of the second electrode 62 and from the second portion 62B to the third portion 62C of the second electrode 62 is allowed to be surely suppressed. As a result, the light emission regions 41A and 41B are caused to be in the forward bias state, and further, the saturable absorption region 42 is allowed to be surely caused to be in the reverse bias state. Therefore, the single-mode self-pulsation operation was allowed to be surely caused. In particular, a pulse width of the light pulse was 15 picoseconds, and pulse peak power estimated from a time average power (150 milliwatts/second, about 150 picojoules/pulse) was about 10 watts.

EXAMPLE 2

Figure 7:
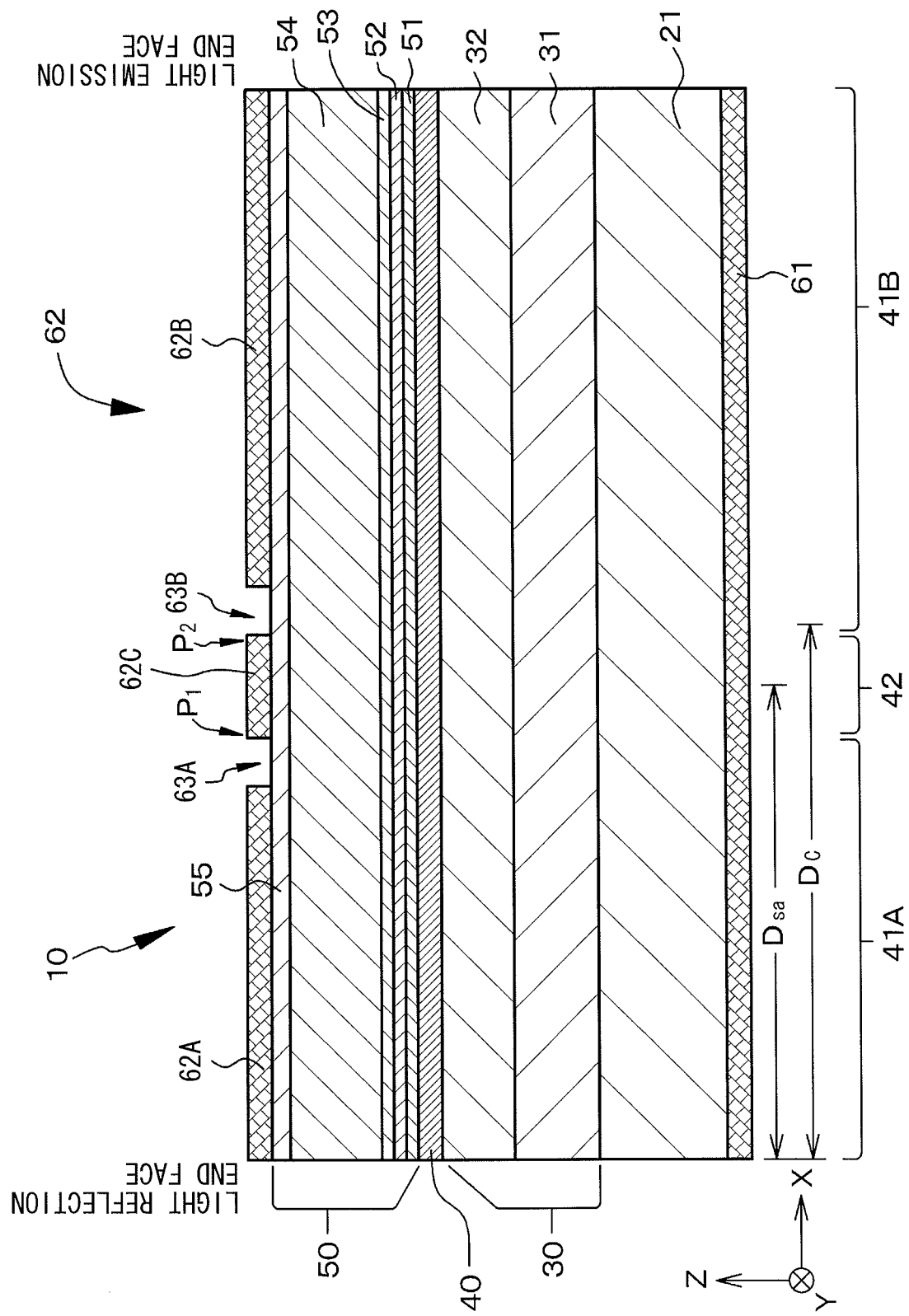
[FIG. 7]

Example 2 relates to the semiconductor laser device according to the second embodiment of the present invention. FIG. 7 is a schematic end-face view (a schematic end-face view taken when the semiconductor laser device is cut in an XZ plane) of the semiconductor laser device 10 of Example 2 along the direction in which the resonator extends. It is to be noted that a schematic cross-sectional view (a schematic cross-sectional view taken when the semiconductor laser device is cut in a YZ plane) thereof along the direction orthogonal to the direction in which the resonator extends is similar to that shown in FIG. 4.

In the semiconductor laser device 10 of Example 2, $$D_{sa}/D_c < 1$$

is satisfied, and preferably, $$0.4 \leq D_{sa}/D_c < 1$$

may be satisfied, where $D_c$ is a distance, along an axial line of the semiconductor laser device, from the end face on the first light emission region side to the center of the semiconductor laser device and $D_{sa}$ is a distance, along the axial line of the semiconductor laser device, from the end face on the first light emission region side to the center of the saturable absorption region 42. It is to be noted that the determination of $$0.4 \leq D_{sa}/D_c < 1$$

is a result obtained by performing various tests and simulations.

In the semiconductor laser device 10 of Example 2, a value of $D_{sa}/D_c$ is determined so that $$0.2 \leq I_1/I_2 \leq 4.5$$

is satisfied, and preferably, $$I_1/I_2 = 1.0$$

may be satisfied, where $I_1$ is the light intensity of the portion of the saturable absorption region 42 corresponding to the region of the third portion 62C that faces the first portion 62A of the second electrode 62, and $I_2$ is the light intensity of the portion of the saturable absorption region 42 corresponding to the region of the third portion 62C that faces the second portion 62B of the second electrode 62.

Further, in the semiconductor laser device 10 according to Example 2, $$0.2 \leq K_1/K_2 \leq 4.5$$

is satisfied, and preferably, $$K_1/K_2 = 1.0$$

may be satisfied where $K_1$ and $K_2$ are set as follows.

$$K_1 \equiv \exp[g(x \cdot L_0 - L_{sa}/2)] + r_2 \cdot \exp[g(x \cdot L_0 - L_{sa}/2) - 2 \cdot \alpha \cdot L_{sa} + 2 \cdot g\{(1-x)L_0 - L_{sa}/2\}]$$

$$K_2 \equiv \exp[g(x \cdot L_0 - L_{sa}/2) - \alpha \cdot L_{sa}] + r_2 \cdot \exp[g(x \cdot L_0 - L_{sa}/2) - \alpha \cdot L_{sa} + 2 \cdot g\{(1-x)L_0 - L_{sa}/2\}]$$

Further, in this case, the value of the absorption coefficient α of the saturable absorption region 42 satisfies $$0\ cm^{-1} < \alpha \leq 5000\ cm^{-1},$$

and may preferably satisfy $$500\ cm^{-1} \leq \alpha \leq 4000\ cm^{-1}.$$

Specifically, also in Example 2, $$\alpha = 1000\ cm^{-1}$$

was satisfied.

It is to be noted that g is as follows, $$g = [2(L_0 - L_{sa})]^{-1} \cdot \ln[1/\{r_1 \cdot r_2 \cdot \exp(-2 \cdot \alpha \cdot L_{sa})\}]$$

where $L_0$: the distance from the end face on the first light emission region side to the end face on the second light emission region side x: the value ($L_{sa}/L_0$) obtained by normalizing the distance $L_{sa}$ from the end face on the first light emission region side to the center of the saturable absorption region 42 by $L_0$, $0 < x < \frac{1}{2}$ Lsa: the length of the saturable absorption region 42

$r_1$: the light reflectance of the end face on the first light emission region side $r_2$: the light reflectance of the end face on the second light emission region side α: the absorption coefficient of the saturable absorption region 42.

Here, when $$\text{light intensity } IL_{r-1} = 1.00,$$

the light intensity $IL_{r-2}$, the light intensity $IL_{r-3}$, the light intensity $IL_{r-4}$, the light intensity $IL_{r-5}$, the light intensity $IL_{r-6}$, the light intensity $IL_{r-7}$, the light intensity $IL_{r-8}$, and the light intensity $IL_{r-9}$ are expressed as follows. It is to be noted that the gain g in the second light emission region 41B is equal to the gain g in the first light emission region 41A, unlike in Example 1. Therefore, when light propagates the distance D, the light is amplified or attenuated to exp(g·D) in the first light emission region 41A and the second light emission region 41B, and to exp(−α·D) in the saturable absorption region 42 where g is the gain in the first light emission region 41A and the second light emission region 41B. Therefore, the light intensity is as follows.

$$IL_{r-1} = 1.00$$

$$IL_{r-2} = \exp[g(x \cdot L_0 - L_{sa}/2)]$$

$IL_{r-3}=\exp[g(x \cdot L_0-L_{sa}/2)-\alpha \cdot L_{sa}]$ $IL_{r-4}=\exp[g(x \cdot L_0-L_{sa}/2)-\alpha \cdot L_{sa}+g\{(1-x)L_0-L_{sa}/2\}]$ $IL_{r-5}=r_2[\exp[g(x \cdot L_0-L_{sa}/2)-\alpha \cdot L_{sa}+g\{(1-x)L_0-L_{sa}/2\}]$ $IL_{r-6}=r_2[\exp[g(x \cdot L_0-L_{sa}/2)-\alpha \cdot L_{sa}+2 \cdot g\{(1-x)L_0-L_{sa}/2\}]$ $IL_{r-7}=r_2[\exp[g(x \cdot L_0-L_{sa}/2)-2 \cdot \alpha \cdot L_{sa}+2 \cdot g\{(1-x)L_0-L_{sa}/2\}]$ $IL_{r-8}=r_2[\exp[2 \cdot g(x \cdot L_0-L_{sa}/2)-2 \cdot \alpha \cdot L_{sa}+2 \cdot g\{(1-x)L_0-L_{sa}/2\}]$ $IL_{r-9}=r_1 \cdot r_2[\exp[2 \cdot g(x \cdot L_0-L_{sa}/2)-2 \cdot \alpha \cdot L_{sa}+2 \cdot g\{(1-x)L_0-L_{sa}/2\}]$ Here, light intensity of the first region $P_1$ of the saturable absorption region is $(IL_{r-2}+IL_{r-7})$ and light intensity of the second region $P_2$ of the saturable absorption region is $(IL_{r-3}+IL_{r-6})$. Further, in order to satisfy $(IL_{r-2}+IL_{r-7})=(IL_{r-3}+IL_{r-6})$, various parameters, specifically, values of $\alpha$, x, g, $r_1$, $r_2$, $L_0$, and $L_{sa}$ may be determined and adjusted so that the following is satisfied.

$\exp[g(x \cdot L_0-L_{sa}/2)]+r_2[\exp[g(x \cdot L_0-L_{sa}/2)-2 \cdot \alpha \cdot L_{sa}+2 \cdot g\{(1-x)L_0-L_{sa}/2\}]=\exp[g(x \cdot L_0-L_{sa}/2)-\alpha \cdot L_{sa}]+r_2[\exp[g(x \cdot L_0-L_{sa}/2)-\alpha \cdot L_{sa}+2 \cdot g\{(1-x)L_0-L_{sa}/2\}]$ [B]

As described above, in Example 2, the expression [B] is satisfied by determining the value of x.

Figure 8:
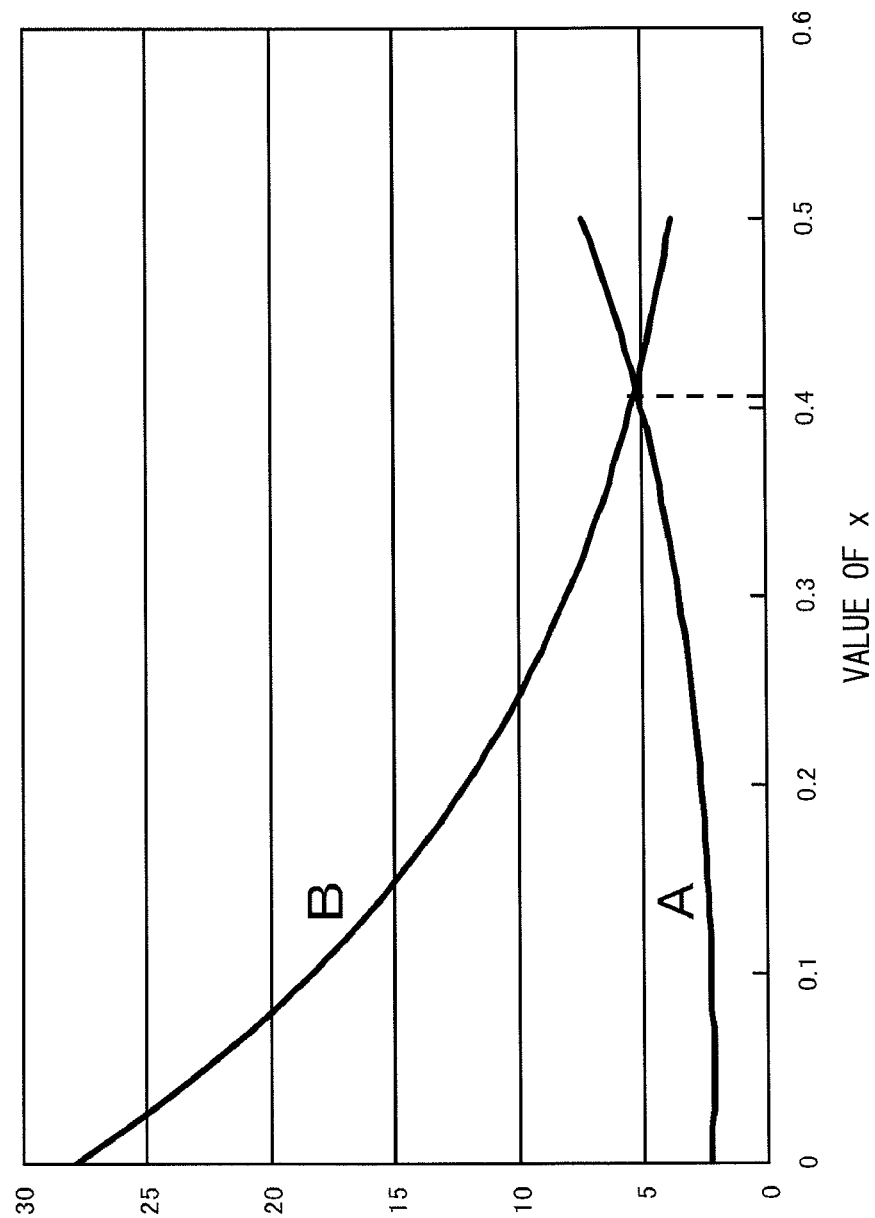
[FIG. 8]

Further, gain coefficients of the first light emission region (gain region) 41A and the second light emission region (gain region) 41B are expressed as in the above expression based on an oscillation condition at the time of oscillation, $IL_{r-1}=IL_{r-9}$ Here, a value of $(IL_{r-2}+IL_{r-7})$ (illustrated as a curve line "A") and a value of $(IL_{r-3}+IL_{r-6})$ (illustrated as a curve line "B") when the value of x is used as a parameter are illustrated in FIG. 8 where the width of the ridge stripe structure corresponding to the first portion 62A, the second portion 62B, and the third portion 62C of the second electrode 62 is 1.5 μm, and $L_0=600$ μm
$L_{sa}=30$ μm
$\alpha=1000$ cm$^{-1}$
$r_1=80\%$
$r_2=20\%$.

In FIG. 8, a lateral axis indicates the value of x and the vertical axis indicates the light intensity (unit may be any unit). When x=0.41, a state of $(IL_{r-2}+IL_{r-7})=(IL_{r-3}+IL_{r-6})$ was obtained. It is to be noted that, as can be seen from FIG. 8, the value of $(IL_{r-3}+IL_{r-6})/(IL_{r-2}+IL_{r-7})$ is 2.35 when x=0.3.

As described above, in the semiconductor laser device 10 of Example 2, since $D_{sa}/D_c<1$ is satisfied, the light intensity of the first region of the saturable absorption region is substantially equal to or is equal to the light intensity of the second region of the saturable absorption region. Therefore, the occurrence of the phenomenon that the light intensity of the first region of the saturable absorption region becomes excessively high is allowed to be suppressed, and therefore, damage is less likely to be caused in the first region of the saturable absorption region. Moreover, an electric field is less likely to be concentrated on the first region of the third portion of the second electrode. In other words, an electric field in the first region of the third portion is substantially equal to or is equal to an electric field in the second region of the third portion. Therefore, damage is less likely to be caused in the third portion of the second electrode. Moreover, as a result of an electric filed being less likely to be concentrated on the boundary region of the saturable absorption region, light density is reduced, and therefore, damage is less likely to be caused in the boundary region of the saturable absorption region.

The present invention has been described above based on preferred Examples. However, the present invention is not limited to those Examples. The configurations and structures of the semiconductor laser devices described in the Examples are examples and may be modified as appropriate. Further, various values have been described in Examples. However, those are also examples and it goes without saying that those values are varied, for example, according to variation in spec of the semiconductor laser device to be used. The configuration and the structure of the semiconductor laser device described in Example 1 and the configuration and the structure of the semiconductor laser device described in Example 2 may be used in combination. Further, for example, the second electrode may be a laminate structure including a lower metal layer formed of palladium (Pd) with a thickness of 20 nm and an upper metal layer formed of nickel (Ni) with a thickness of 200 nm. Here, upon the wet etching with the use of the aqua regia, the etching rate of nickel is about 1.25 times of the etching rate of palladium.

In the laser structure of the semiconductor laser device of the present invention, the distance ($L_0$) from the end face on the first light emission region side to the end face on the second light emission region side, the length ($L_{sa}$) of the saturable absorption region, the light reflectance ($r_1$) of the end face on the first light emission region side, the light reflectance ($r_2$) of the end face on the second light emission region side, the gains in the first light emission region and the second light emission region, the absorption coefficient ($\alpha$) of the saturable absorption region, the value ($x \equiv L_{sa}/L_0$) obtained by normalizing the distance $L_{sa}$ from the end face on the first light emission region side to the center of the saturable absorption region by $L_0$, and the value of the ratio ($K \equiv W_{2-ave}/W_{1-ave}$) between the average width $W_{1-ave}$ of the portion having the ridge stripe structure of the first portion of the second electrode and the average width $W_{2-ave}$ of the portion having the ridge stripe structure of the second portion of the second electrode, preferably, the value of x, the value of K, or both the value of x and the value of K may be determined and adjusted so that $0.2 \leq I_1/I_2 \leq 4.5$ is satisfied, and preferably, $I_1/I_2=1.0$ may be satisfied, where $I_1$ is the light intensity of the portion of the saturable absorption region corresponding to the region of the third portion that faces the first portion of the second electrode, and $I_2$ is the light intensity of the portion of the saturable absorption region corresponding to the region of the third portion that faces the second portion of the second electrode.

Figure 9:
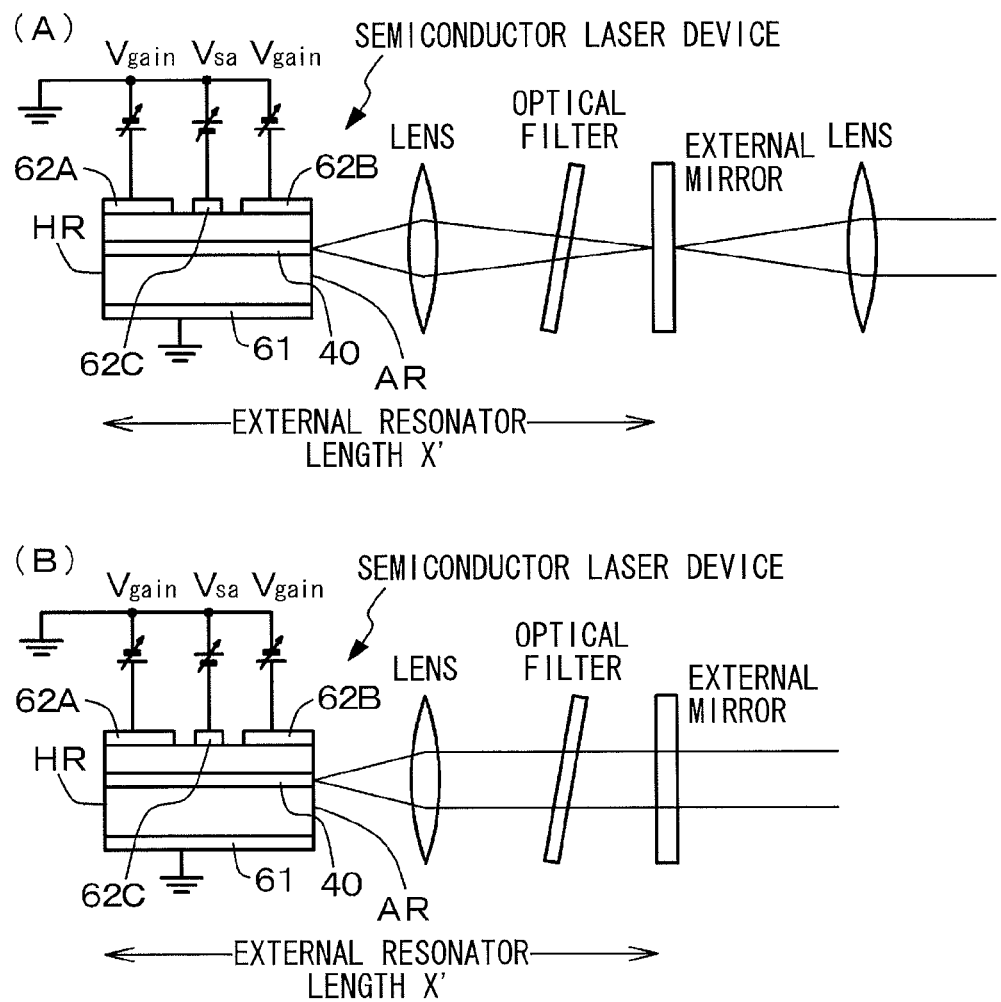
[FIG. 9] Parts (A) and (B) of FIG. 9 are each a diagram schematically illustrating a semiconductor laser device assembly in which an external resonator is configured with the use of the semiconductor laser device of the present invention and performs mode-locking operation.

Part (A) of FIG. 9 illustrates a semiconductor laser device assembly that performs mode-locking operation in which a light-concentrating-type external resonator is configured with the use of the semiconductor laser device of the present invention. In the light-concentrating-type external resonator shown in Part (A) of FIG. 9, the external resonator is configured of an external mirror and an end face of the semiconductor laser device provided with a high reflective coating layer (HR) formed on the saturable absorption region side thereof, and a light pulse is extracted from the external mirror. An anti-reflective coating layer (AR) is formed on the end face (light emission end face) of the semiconductor laser device on the second light emission region (gain region) side. Mainly, a bandpass filter is used as an optical filter and is inserted in order to control an oscillation wavelength of the laser. It is to be noted that the mode locking is determined by the direct current that is applied to the first light emission region and the second light emission region, and the reverse bias voltage $V_{sa}$ that is applied to the saturable absorption region. A repetition frequency f of a light pulse train is determined by an external resonator length X' and is expressed as the following expression. Here, c is the speed of light and n is a refractive index of a waveguide.

$$f=c/(2n \cdot X')$$

Alternatively, Part (B) of FIG. 9 illustrates a modification of the example in which the external resonator is configured with the use of the semiconductor laser device of the present invention. Also in the collimated-type external resonator shown in Part (B) of FIG. 9, the external resonator is configured of the external mirror and the end face of the semiconductor laser device provided with the high reflective coating layer (HR) formed on the saturable absorption region side thereof, and the light pulse is extracted from the external mirror. The anti-reflective coating layer (AR) is formed on the end face (light emission end face) of the semiconductor laser device on the second light emission region (gain region) side.

In Examples, the semiconductor laser device was provided on the C plane, that is, the {0001} plane that is a polar plane of the n-type GaN substrate 21. In such a case, saturable absorption may be less likely to be controlled electrically in some cases due to a QCSE effect (quantum-confined Stark effect) of the inner electric field resulting from piezo polarization and spontaneous polarization in the third compound semiconductor layer. Specifically, in some cases, it may be necessary to increase the value of the direct current which is applied to the first electrode and the value of the reverse bias voltage which is applied to the saturable absorption region in order to obtain the self-pulsation operation and the mode-locking operation, a sub-pulse component accompanying the main pulse may be occurred, or synchronization between the external signal and the light pulse may be difficult. In order to suppress occurrence of such phenomena, the semiconductor laser device may be provided on a non-polar plane such as an A plane that is a {11-20} plane, an M plane that is a {1-100} plane, and a {1-102} plane, or on a semi-polar plane such as a {11-2n} plane including planes such as a {11-24} plane and a {11-22} plane, a {10-11} plane, and a {10-12} plane. Accordingly, even when the piezo polarization and the spontaneous polarization occur in the third compound semiconductor layer in the semiconductor laser device, the piezo polarization does not occur in the thickness direction of the third compound semiconductor layer, and the piezo polarization occurs in a direction that is substantially orthogonal to the thickness direction of the third compound semiconductor layer. Therefore, adverse influence resulting from the piezo polarization and the spontaneous polarization is allowed to be eliminated. It is to be noted that the {11-2n} plane refers to a non-polar plane that forms an angle of about 40 degrees with respect to the C plane. Further, when the semiconductor laser device is provided on the non-polar plane or the semi-polar plane, the limit (1 nm or larger and 10 nm or smaller) in the thickness of the well layer and the limit ($2 \times 10^{18}$ cm$^{-3}$ or higher and $1 \times 10^{20}$ cm$^{-3}$ or lower) in the impurity doping concentration of the barrier layer as described in Example 1 are allowed to be eliminated.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A semiconductor laser device comprising:
a laminate structure in which
  a first compound semiconductor layer having a first conductivity type and being formed of a GaN-based compound semiconductor,
  a third compound semiconductor layer formed of a GaN-based compound semiconductor, the third compound semiconductor layer configuring a first light emission region, a second light emission region, and a saturable absorption region that is sandwiched by the first light emission region and the second light emission region, and
  a second compound semiconductor layer having a second conductivity type that is different from the first conductivity type and being formed of a GaN-based compound semiconductor
are laminated in order;
a second electrode formed on the second compound semiconductor layer; and
a first electrode electrically connected to the first compound semiconductor layer, wherein
the laminate structure has a ridge stripe structure,
the second electrode is configured of a first portion, a second portion, and a third portion, the first portion causing a forward bias state by applying a direct current to the first electrode via the first light emission region, the second portion causing the forward bias state by applying a direct current to the first electrode via the second light emission region, and the third portion applying an electric field to the saturable absorption region,
the first portion of the second electrode is separated from the third portion of the second electrode by a first separation groove,
the second portion of the second electrode is separated from the third portion of the second electrode by a second separation groove,
laser light is emitted from an end face on a second light emission region side of the semiconductor laser device,
$1 < W_{2\text{-}ave}/W_{1\text{-}ave}$ is satisfied such that a light intensity of the first light emission region is at least substantially equal to a light intensity of the second light emission region, where $W_{1\text{-}ave}$ is an average width of a portion having the ridge stripe structure of the first portion of the second electrode and $W_{2\text{-}ave}$ is an average width of a portion having the ridge stripe structure of the second portion of the second electrode, and
wherein $0.2 \leq K_1/K_2 \leq 4.5$ is satisfied where $K_1$ and $K_2$ are set as follows, $$K_1 \equiv \exp[g(x \cdot L_0 - L_{sa}/2)] + r_2 \cdot \exp[g(x \cdot L_0 - L_{sa}/2) - 2 \cdot \alpha \cdot L_{sa} + 2 \cdot K \cdot g\{(1-x)L_0 - L_{sa}/2\}]$$

$$K_2 \equiv \exp[g(x \cdot L_0 - L_{sa}/2) - \alpha \cdot L_{sa}] + r_2 \cdot \exp[g(x \cdot L_0 - L_{sa}/2) - \alpha \cdot L_{sa} + 2 \cdot K \cdot g\{(1-x)L_0 - L_{sa}/2\}]$$

It is to be noted that g and K are as follows, $$g = [2\{x + K(1-x)L_0\} - L_{sa}(1+K)]^{-1} \cdot \ln[1/\{r_1 \cdot r_2 \cdot \exp(-2 \cdot \alpha \cdot L_{sa})\}]$$

$$K \equiv W_{2\text{-}ave}/W_{1\text{-}ave}$$

where
$L_0$: a distance from an end face on a first light emission region side to the end face on the second light emission region side x: a value ($L_{sa}/L_0$) obtained by normalizing a distance $L_{sa}$ from the end face on the first light emission region side to a center of the saturable absorption region by $L_0$, $0<x<1$ $L_{sa}$: a length of the saturable absorption region $r_1$: light reflectance of the end face on the first light emission region side $r_2$: light reflectance of the end face on the second light emission region side α: an absorption coefficient of the saturable absorption region.

2. The semiconductor laser device according to claim 1, wherein $1<W_{2-ave}/W_{1-ave}\leq 4.5$ is satisfied.

3. The semiconductor laser device according to claim 1, wherein a value of $W_{2-ave}/W_{1-ave}$ is determined to cause $0.2\leq I_1/I_2\leq 4.5$ to be satisfied where $I_1$ is light intensity of a portion of the saturable absorption region corresponding to a region of the third portion that faces the first portion of the second electrode and $I_2$ is light intensity of a portion of the saturable absorption region corresponding to a region of the third portion that faces the second portion of the second electrode.

4. The semiconductor laser device according to claim 1, wherein a value of the absorption coefficient α of the saturable absorption region satisfies $0\ cm^{-1}<\alpha\leq 5000\ cm^{-1}$.

5. The semiconductor laser device according to claim 1, wherein a value of a voltage that is applied to the third portion of the second electrode is equal to or smaller than −2 volts.

6. A semiconductor laser device comprising:
a laminate structure in which
  a first compound semiconductor layer having a first conductivity type and being formed of a GaN-based compound semiconductor,
  a third compound semiconductor layer formed of a GaN-based compound semiconductor, the third compound semiconductor layer configuring a first light emission region, a second light emission region, and a saturable absorption region that is sandwiched by the first light emission region and the second light emission region, and
  a second compound semiconductor layer having a second conductivity type that is different from the first conductivity type and being formed of a GaN-based compound semiconductor
are laminated in order;
a second electrode formed on the second compound semiconductor layer; and
a first electrode electrically connected to the first compound semiconductor layer, wherein
the laminate structure has a ridge stripe structure,
the second electrode is configured of a first portion, a second portion, and a third portion, the first portion causing a forward bias state by applying a direct current to the first electrode via the first light emission region, the second portion causing the forward bias state by applying a direct current to the first electrode via the second light emission region, and the third portion applying an electric field to the saturable absorption region,
the first portion of the second electrode is separated from the third portion of the second electrode by a first separation groove,
the second portion of the second electrode is separated from the third portion of the second electrode by a second separation groove,
laser light is emitted from an end face on a second light emission region side of the semiconductor laser device, and
$D_{sa}/D_c<1$ is satisfied such that a light intensity of the first light emission region is at least substantially equal to a light intensity of the second light emission region, where $D_c$ is a distance, along an axial line of the semiconductor laser device, from an end face on a first light emission region side to a center of the semiconductor laser device and $D_{sa}$ is a distance, along the axial line of the semiconductor laser device, from the end face on the first light emission region side to a center of the saturable absorption region.

7. The semiconductor laser device according to claim 6, wherein $0.4\leq D_{sa}/D_c<1$ is satisfied.

8. The semiconductor laser device according to claim 6, wherein a value of $D_{sa}/D_c$ is determined to cause $0.2\leq I_1/I_2\leq 4.5$ to be satisfied where $I_1$ is light intensity of a portion of the saturable absorption region corresponding to a region of the third portion that faces the first portion of the second electrode and $I_2$ is light intensity of a portion of the saturable absorption region corresponding to a region of the third portion that faces the second portion of the second electrode.

9. The semiconductor laser device according to claim 6, wherein $0.2\leq K_1/K_2\leq 4.5$ is satisfied where $K_1$ and $K_2$ are set as follows, $$K_1 \equiv \exp[g(x\cdot L_0 - L_{sa}/2)] + r_2\cdot\exp[g(x\cdot L_0 - L_{sa}/2) - 2\cdot\alpha\cdot L_{sa} + 2\cdot g\{(1-x)L_0 - L_{sa}/2\}]$$

$$K_2 \equiv \exp[g(x\cdot L_0 - L_{sa}/2) - \alpha\cdot L_{sa}] + r_2\cdot\exp[g(x\cdot L_0 - L_{sa}/2) - \alpha\cdot L_{sa} + 2\cdot g\{(1-x)L_0 - L_{sa}/2\}]$$

It is to be noted that g is as follows, $$g = [2(L_0 - L_{sa})]^{-1}\cdot\ln[1/\{r_1\cdot r_2\cdot\exp(-2\cdot\alpha\cdot L_{sa})\}]$$

where $L_0$: the distance from the end face on the first light emission region side to the end face on the second light emission region side x: the value ($L_{sa}/L_0$) obtained by normalizing the distance $L_{sa}$ from the end face on the first light emission region side to the center of the saturable absorption region by $L_0$, $0<x<½$ $L_{sa}$: the length of the saturable absorption region $r_1$: the light reflectance of the end face on the first light emission region side $r_2$: the light reflectance of the end face on the second light emission region side α: the absorption coefficient of the saturable absorption region.

10. The semiconductor laser device according to claim 9, wherein a value of the absorption coefficient α of the saturable absorption region satisfies $0\ cm^{-1}<\alpha\leq 5000\ cm^{-1}$.

11. The semiconductor laser device according to claim 6, wherein a value of a voltage that is applied to the third portion of the second electrode is equal to or smaller than −2 volts.

* * * * *